United States Patent
Kitakado

(10) Patent No.: US 9,059,294 B2
(45) Date of Patent: Jun. 16, 2015

(54) SEMICONDUCTOR DEVICE, ACTIVE MATRIX SUBSTRATE, AND DISPLAY DEVICE

(75) Inventor: Hidehito Kitakado, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 373 days.

(21) Appl. No.: 13/520,853

(22) PCT Filed: Sep. 24, 2010

(86) PCT No.: PCT/JP2010/066544
§ 371 (c)(1),
(2), (4) Date: Jul. 6, 2012

(87) PCT Pub. No.: WO2011/083598
PCT Pub. Date: Jul. 14, 2011

(65) Prior Publication Data
US 2012/0320004 A1    Dec. 20, 2012

(30) Foreign Application Priority Data
Jan. 7, 2010    (JP) ................................. 2010-002147

(51) Int. Cl.
G06F 3/038    (2013.01)
H01L 29/786    (2006.01)
(Continued)

(52) U.S. Cl.
CPC ..... *H01L 29/78645* (2013.01); *H01L 29/78633* (2013.01); *H01L 27/1214* (2013.01);
(Continued)

(58) Field of Classification Search
CPC .................... H01L 27/1214; H01L 29/78633;
G02F 1/13624; G02F 1/1368; G09G 3/3648; G09G 2300/0814; G09G 2300/0819; G09G 2320/0214; G09G 2330/021
USPC .............. 345/87, 92, 204; 349/38–39, 42–44, 349/127; 257/88, 296, E29.342, E33.052, 257/E33.053
See application file for complete search history.

(56) References Cited

U.S. PATENT DOCUMENTS 5,420,048 A * 5/1995 Kondo .......................... 438/157
5,650,636 A * 7/1997 Takemura et al. ............... 257/59
(Continued)

FOREIGN PATENT DOCUMENTS

JP    H4-251818 A    9/1992
JP    08-213627 A    8/1996
(Continued)

OTHER PUBLICATIONS

International Search Report (ISR) issued in PCT/JP2010/066544 mailed in Oct. 2010.

*Primary Examiner* — Amare Mengistu
*Assistant Examiner* — Stacy Khoo
(74) *Attorney, Agent, or Firm* — Chen Yoshimura LLP

(57) ABSTRACT

A switching circuit (semiconductor device) (18) includes two switching units (SW1 and SW2), which are connected in series to each other, and two capacitances (CS1 and CS2), where one electrode of one of the capacitances is connected to the connecting section of the switching units (SW1 and SW2) and one electrode of the other capacitance is connected to one end of the switching units (SW1 and SW2). To the other electrodes of the capacitances (CS1 and CS2), signals having a constant voltage or signals having a same phase are supplied. A bottom gate electrode (light-shielding film) (22) is formed for the switching unit (SW2).

14 Claims, 27 Drawing Sheets

(51) Int. Cl.
*H01L 27/12* (2006.01)
*G02F 1/1334* (2006.01)
*G02F 1/1362* (2006.01)
*G02F 1/1368* (2006.01)
*G09G 3/36* (2006.01)

(52) U.S. Cl.
CPC .......... *G02F1/1334* (2013.01); *G02F 1/13624* (2013.01); *G02F 1/1368* (2013.01); *G09G 3/3648* (2013.01); *G09G 2300/0814* (2013.01); *G09G 2300/0819* (2013.01); *G09G 2300/0852* (2013.01); *G09G 2320/0214* (2013.01); *G09G 2320/041* (2013.01); *G09G 2330/021* (2013.01); *G09G 2340/0435* (2013.01); *G09G 2360/144* (2013.01)

(56) References Cited

U.S. PATENT DOCUMENTS

| | | | |
|---|---|---|---|
| 6,930,667 B1 * | 8/2005 | Iijima et al. | 345/101 |
| 6,952,244 B2 * | 10/2005 | Cairns et al. | 349/43 |
| 2002/0093474 A1 * | 7/2002 | Toyoshima et al. | 345/87 |

FOREIGN PATENT DOCUMENTS

| JP | 11-271709 A | | 10/1999 |
|---|---|---|---|
| JP | 2004163829 A | * | 6/2004 |
| JP | 2008-117863 A | | 5/2008 |

* cited by examiner (a)

(b)

(c)

(a)

(b)

(c)

(a)

(b)

(c)

(a)

(b)

(c)

(a)

(b)

(a)

(b)

(a)

(b)

SEMICONDUCTOR DEVICE, ACTIVE MATRIX SUBSTRATE, AND DISPLAY DEVICE

TECHNICAL FIELD

The present invention relates to a semiconductor device equipped with switching elements such as transistors, and also to an active matrix substrate and a display device using the semiconductor device.

BACKGROUND ART

In recent years, liquid crystal display devices, for example, which are thinner and lighter among other characteristics than conventional cathode-ray tubes are in wide use as flat panel displays for liquid crystal televisions, monitors, portable phones, and the like. Among such liquid crystal display devices, those using an active matrix substrate for a liquid crystal panel serving as the display panel are known. Such active matrix substrates include a plurality of data wirings (source electrode wirings) and a plurality of scan wirings (gate electrode wirings) arranged in a matrix, and pixels disposed near the intersections of the data wirings and the scan wirings, each pixel having a switching element such as a thin film transistor (hereinafter simply referred to as "TFT") and a pixel electrode connected to the switching element.

In general, in the active matrix substrate described above, thin film transistors for peripheral circuits are integrally provided in addition to those used as switching elements for pixel driving. Further, for active matrix substrates used in liquid crystal display devices equipped with a touch panel or in liquid crystal display devices equipped with illuminance sensors (ambient sensors), it has been proposed to integrally provide photodiodes (thin film diode: TFD) as optical sensors in addition to thin film transistors for pixel driving and for peripheral circuits. Thus, active matrix substrates use semiconductor devices equipped with a plurality of thin film transistors and photodiodes.

In recent years, to meet the demand for lower power consumption feature of the above-mentioned liquid crystal panels with built-in optical sensors and liquid crystal panels with built-in pixel memories, for example, a need for leakage current reduction of thin film transistors (transistors) of the semiconductor devices described above is beginning to be recognized. A known structure for suppressing the leakage current of transistors employed in conventional semiconductor devices is the LDD structure, where a low concentration impurity region (LDD region: Lightly Doped Drain) having a higher resistance than the source region or the drain region is disposed at least either between the channel region and the source region or between the channel region and the drain region.

Also, as described in Patent Document 1 below, for example, in the case of conventional semiconductor devices, it has been considered as possible to connect a plurality of (two, for example) thin film transistors (switching units) in series, i.e., first and second thin film transistors, and to connect a storage capacitance (capacitance) to the connecting section of the first and second thin film transistors to set the source-drain voltage of the second thin film transistor, to which the liquid crystal capacitance of the liquid crystal panel is connected, to almost 0V and to make the leakage current of the second thin film transistor very small. Also, it has been considered that such a conventional semiconductor device can suppress the pixel voltage fluctuation at the liquid crystal capacitance. Also, regarding this conventional semiconductor device, it has been proposed to further suppress the fluctuation of the pixel voltage, which voltage is at one end of the first and second thin film transistors, by connecting another storage capacitance to the second thin film transistor in parallel to the liquid crystal capacitance.

RELATED ART DOCUMENTS

Patent Documents

Patent Document 1: Japanese Patent Application Laid-Open Publication No. H4-251818

SUMMARY OF THE INVENTION

Problems to be Solved by the Invention

However, in a conventional semiconductor device such as described above, no light-shielding film was disposed for the second thin film transistor (switching unit). Therefore, this conventional semiconductor device had a problem that it could not reliably suppress the leakage current, and consequently fluctuations in the pixel voltage could not be avoided.

Here, problems with the conventional semiconductor device are described in detail with reference to FIG. 28.

FIG. 28 is a graph showing the relationship between the source-drain voltage and the leakage current of a thin film transistor.

In FIG. 28, voltages Vds shown on the horizontal axis represent source-drain voltages of one of the thin film transistors connected in series. Also in FIG. 28, curve 80 represents the relationship between the voltage Vds and (light) leakage current Ioff when illumination light (4200 lux, for example) is projected from the backlight device provided in the liquid crystal display device. Further, curves 81 and 82 represent the relationship between the voltage Vds and the leakage current Ioff when the ambient temperature of the thin film transistor is 40° C. and 60° C., respectively.

As apparent from curves 80, 81 and 82, when the source-drain voltage Vds of each thin film transistor is below approx. 1V, the leakage current Ioff caused by the illumination light is larger than the leakage current Ioff caused by the elevated ambient temperature. Therefore, conventional semiconductor devices could not reliably suppress the leakage current. As a result, the conventional semiconductor device could not suppress the fluctuation of the pixel voltage, which is at one end of the first and second thin film transistors (switching units).

In consideration of the problems described above, the present invention is aiming at providing a semiconductor device that can reliably suppress the leakage current even when a plurality of switching units are connected in series and a capacitance is connected to a connecting section of the switching units, and that can suppress the voltage fluctuation at one end of the plurality of switching units. The present invention is also aiming at providing an active matrix substrate and a display device using such a semiconductor device.

Means for Solving the Problems

In order to achieve the objectives stated above, a semiconductor device according to the present invention includes a switching unit having at least one switching element, wherein a plurality of the switching units are connected in series to each other, wherein the semiconductor device further includes a plurality of capacitances, one electrode of each of the capacitances being connected to corresponding one of connecting sections of the plurality of switching units or to one end of the plurality of switching units, wherein signals having a constant voltage or signals having a same phase are supplied to the other electrode of each of the plurality of capacitances, and wherein the semiconductor device further includes a light-shielding film formed at least for the switching unit, among the plurality of switching units, that has a capacitance disposed on both sides of the switching units.

In the semiconductor device configured as described above, signals having a constant voltage or signals having the same phase are supplied to the other electrodes of the plurality of capacitances. Thus, voltages between the plurality of switching units can be set to the same voltage, and therefore leakage current caused by the voltage difference between one end and the other end of the individual switching unit can be prevented from occurring. Also, in the plurality of switching units, a light-shielding film is formed for at least the switching unit having a capacitance on both sides. This way, leakage current caused by light can be prevented from occurring. As a result, a semiconductor device that, unlike conventional examples, can reliably suppress the leakage current even when the plurality of the switching units are connected in series and a capacitance is connected to the connecting section of the switching units, and can minimize the voltage fluctuation at one end of the plurality of switching units can be configured.

Also in the semiconductor device, preferably an MIS (Metal-Insulator-Semiconductor) type transistor is used as the switching element of the switching unit.

In this case, the configuration of the switching unit can be simplified, and a semiconductor device that is easy to manufacture can readily be configured.

Also in the above-mentioned semiconductor device, preferably a double gate structure transistor including a semiconductor layer, and a top gate electrode and a bottom gate electrode disposed to sandwich the semiconductor layer is used in the switching unit as the MIS-type transistor.

In this case, the current drive force (ON current) of the switching unit can easily be increased.

Also in the above-mentioned semiconductor device, the top gate electrode and the bottom gate electrode of the double gate structure transistor may be electrically connected to each other.

In this case, by controlling the potentials at the top gate electrode and at the bottom gate electrode, the potential fluctuation at the bottom gate electrode caused by the capacitive coupling between the bottom gate electrode and the semiconductor layer can be prevented, and therefore leakage current can be prevented from occurring.

Also in the above-mentioned semiconductor device, the top gate electrode and the bottom gate electrode in the double gate structure transistor may be capacitively coupled with each other.

In this case, by controlling the potential at the top gate electrode, the potential at the bottom gate electrode can appropriately be controlled, and the fluctuation of the potential at the bottom gate electrode to an inappropriate level that is likely to trigger the leakage current, which is caused by the capacitive coupling between the bottom gate electrode and the semiconductor layer, can be prevented, and thus the leakage current can be prevented from occurring. In stead of this configuration, the potential at the capacitively coupled top gate electrode may be controlled by controlling the potential at the bottom gate electrode.

Also in the above-mentioned semiconductor device, preferably the bottom gate electrode is used as the light-shielding film.

In this case, the configuration of the semiconductor device is prevented from becoming complex and large, and a semiconductor device that is easy to manufacture can readily be configured.

Also in the above-mentioned semiconductor device, the plurality of capacitances are preferably connected in parallel to each other.

In this case, the area of each of the plurality of capacitances can be reduced, and therefore a compact semiconductor device can easily be configured.

Also in the above-mentioned semiconductor device, the plurality of switching units are constituted of the first and the second switching units, which are connected in series, and when the capacitance value of the first capacitance connected between the first and the second switching units is Cs1, the capacitance value of the second switching unit connected on the side opposite from the first switching unit is Cs2, and the OFF leakage current value Ioff of the second switching unit is approximated by Equation (1) below, the capacitance ratios R1 and R2 of the first and the second capacitances may satisfy Equation (2) and Equation (3) below, respectively.

$$Ioff = Io \times Vds^n \quad (1)$$

$$R1 = \{n/(n+1)\} \times \{(C+Cv)/C\} \pm 0.2 \quad (2)$$

$$R2 = \{1/(n+1)\} \times \{(C-n \times Cv)/C\} \pm 0.2 \quad (3)$$

where Vds is the voltage between one end and the other end of the second switching unit ($0 \leq Vds \leq 1$); Io is the leakage current when Vds=1(V); n=0.7 to 0.8; Cs1:Cs2=R1:R2; R1+R2=1; Cs1+Cs2=C; and Cv is a capacitance value of an external capacitance connected in parallel to the second capacitance for the second switching unit.

In this case, when the capacitance ratios R1 and R2 of the first and second capacitances are optimum, the voltage fluctuation at one end of the plurality of switching units can reliably be suppressed.

Also in the above-mentioned semiconductor device, the plurality of switching units are constituted of the first, the second, and the third switching units that are connected in series, and when the capacitance value of the first capacitance connected between the first and the second switching units is Cs1, the capacitance value connected between the second and the third switching units is Cs2, the capacitance value of the third capacitance connected to an end of the third switching unit on the side opposite from the second switching unit is Cs3, and the OFF leakage current value Ioff of the second and the third switching units is approximated in Equation (1) below, the capacitance ratios R1, R2, and R3 of the first, then the second, and the third capacitances may satisfy Equation (4), Equation (5), and Equation (6) below, respectively.

$$Ioff = Io \times Vds^n \quad (1)$$

$$R1 = \{n \times n/(n \times n + n + 1)\} \times \{(C+Cv)/C\} \pm 0.15 \quad (4)$$

$$R2 = \{n/(n \times n + n + 1)\} \times \{(C+Cv)/C\} \pm 0.15 \quad (5)$$

$$R3 = \{1/(n \times n + n + 1)\} \times \{(C - n \times n \times Cv - n \times Cv)/C\} \pm 0.10 \quad (6)$$

where Vds is the voltage ($0 \leq Vds \leq 1$) between one end and the other end of the second and the third switching units; Io is the leakage current when Vds=1(V); n=0.7 to 0.8; Cs1:Cs2:

Cs3=R1:R2:R3; R1+R2+R3=1; Cs1+Cs2+Cs3=C; and Cv is the capacitance value of the external capacitance connected to the third switching unit, in parallel to the third capacitance.

In this case, when the capacitance ratios R1, R2, and R3 of the first, second, and third capacitances are optimum, the voltage fluctuation on one end of the plurality of switching units can reliably be suppressed.

Also in the above-mentioned semiconductor device, when the plurality of switching units are constituted of the first, second, and third switching units connected in series, and when the capacitance value of the first capacitance connected between the first and second switching units is Cs1, the capacitance value of the second capacitance connected between the second and third switching units is Cs2, the capacitance value of the third capacitance connected to an end of the third switching unit on the side opposite to the second switching unit is Cs3, and the OFF leakage current Ioff of the second and third switching units is approximated by Equation (1) below, then, the capacitance ratios R1 and R2 of the first and the second capacitances may satisfy Equation (7) and Equation (8) below, respectively.

$$\text{Ioff}=Io \times Vds^n \tag{1}$$

$$R1=\{n/(n+1)\}\times\{(C-Cs3)/C\}\pm 0.1 \tag{7}$$

$$R2=\{1/(n+1)\}\times\{(C-Cs3)/C\}\pm 0.1 \tag{8}$$

where Vds is the voltage (0≤Vds≤1) between one end and the other end of the second and the third switching units; Io is the leakage current when Vds=1(V); n=0.7 to 0.8; and Cs1:Cs2=R1:R2; and Cs1+Cs2+Cs3=C.

In this case, even when the capacitance value Cs3 of the third capacitance is set to a prescribed value, by setting the capacitance ratios R1 and R2 of the first and the second capacitances to optimum values, voltage fluctuations at one end of the plurality of switching units can reliably be suppressed.

Also in the above-mentioned semiconductor device, the plurality of capacitances may be split to be disposed on both sides of the plurality of switching units, sandwiching the switching units.

In this case, compared to the case in which a plurality of capacitances are formed on one side of the switching units, a more compact semiconductor device can easily be configured.

An active matrix substrate of the present invention includes any one of the semiconductor devices described above.

The active matrix substrate configured as described above uses the semiconductor device that can reliably suppress the leakage current even when a plurality of switching units are connected in series and a capacitance is connected to the connection section of the switching units, and can suppress the voltage fluctuation at one end of the plurality of switching units. Therefore, the active matrix substrate featuring a high performance and low power consumption can easily be configured.

A display device of the present invention includes a display unit for displaying information, and uses any one of the semiconductor devices described above.

The display device configured as described above uses the semiconductor device that can reliably suppress the leakage current even when a plurality of switching units are connected in series and a capacitance is connected to the connection section of the switching units, and can suppress the voltage fluctuation at one end of the plurality of switching units. Therefore, the display device featuring a high performance and low power consumption can easily be configured.

In the above-mentioned display device, a liquid crystal panel may be used as the display unit.

In this case, the pixel voltage fluctuation at the liquid crystal capacitance of the liquid crystal panel, which liquid crystal capacitance is provided at one end of the plurality of switching units, can be suppressed, and a liquid crystal display device featuring a high display performance can easily be configured. Also, because the leakage current can reliably be suppressed and the pixel voltage fluctuation can be minimized, the frame frequency at the liquid crystal panel can significantly be lowered, and the power consumption of the liquid crystal display device can easily be reduced.

Also in the above-mentioned display device, a reflective liquid crystal panel may be used as the display unit.

In this case, the pixel voltage fluctuation at the liquid crystal capacitance of the liquid crystal panel, which liquid crystal capacitance is disposed at one end of the plurality of switching units, can be suppressed, and therefore, a liquid crystal display device featuring a high display performance can easily be configured. Also, because the leakage current can reliably be suppressed to minimize the pixel voltage fluctuation, the frame frequency at liquid crystal panel can significantly be lowered. Further, because a light-shielding film for blocking the light from the backlight device does not need to be installed, a liquid crystal display device featuring a simple configuration and lower power consumption can easily be configured.

In the above-mentioned display device, preferably the reflective liquid crystal panel includes polymer-dispersed liquid crystals in its liquid crystal layer, and the reflective liquid crystal panel is a retroreflection type liquid crystal panel including a retroreflection sheet.

In this case, a reflective liquid crystal display device using a retroreflection sheet and featuring a high display performance can be configured.

Preferably, the above-mentioned display device includes a sensor that detects the condition of the surrounding environment of the display unit, and a display control unit to which image signals are inputted and which performs the drive control of the display unit, and preferably the display control unit includes a frame frequency adjustment unit that adjusts the frame frequency based at least on either the detection results sent from the sensor or image signals inputted.

In this case, the frame frequency adjustment unit can appropriately adjust the frame frequency of the display image displayed on the display unit. Therefore, a display device with a high display performance can easily be configured.

Also in the above-mentioned display device, the frame frequency adjustment unit may adjust the frame frequency to or below a prescribed frequency in accordance with the image signal inputted.

In this case, the power consumption of the display unit and the display device can be reduced.

Effects of the Invention

The present invention can provide a semiconductor device that can reliably suppress the leakage current even when a plurality of switching units are connected in series and a capacitance is connected to the connecting section of the switching units, and can minimize the voltage fluctuation at one end of the plurality switching units. The present invention can also provide an active matrix substrate and a display device using such a semiconductor device.

DETAILED DESCRIPTION OF EMBODIMENTS

Below, preferred embodiments of a semiconductor device, an active matrix substrate, and a display device of the present invention are described with reference to figures. Described below are examples of cases in which the present invention is applied to the switching circuit for the pixel electrode used in the active matrix substrate of the liquid crystal panel. Dimensions of constituting elements in the figures do not accurately reflect the actual dimensions of the constituting elements, the actual ratio of dimensions of the constituting elements, or the like.

Embodiment 1

Figure 1:
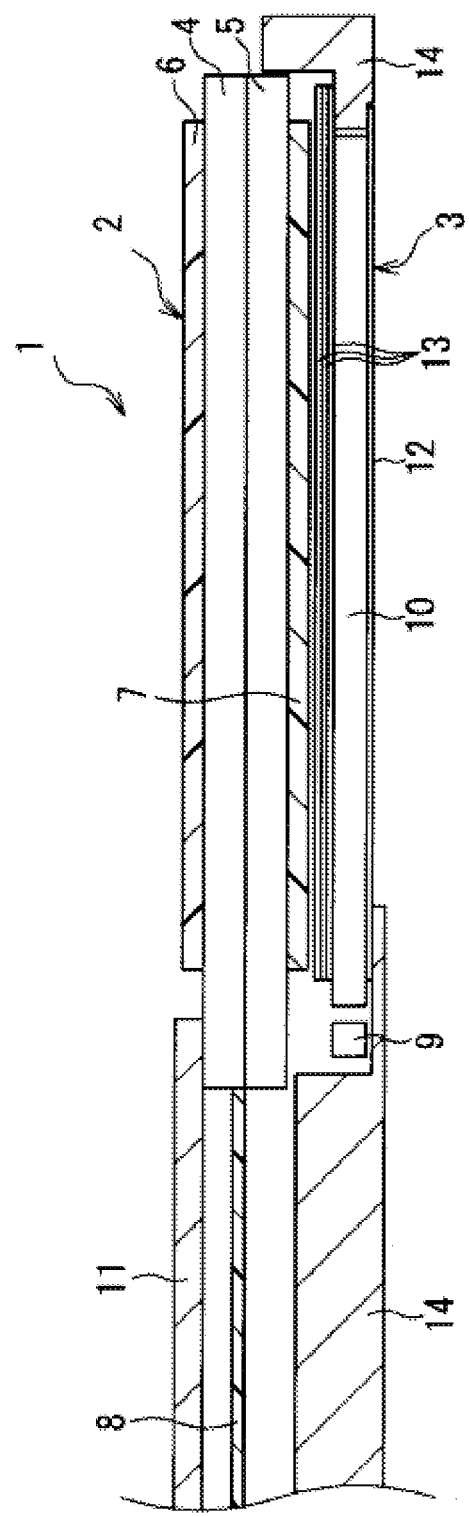
FIG. 1 illustrates a liquid crystal display device according to Embodiment 1 of the present invention.

FIG. 1 illustrates a liquid crystal display device according to Embodiment 1 of the present invention. In FIG. 1, a liquid crystal display device 1 of this embodiment includes a liquid crystal panel 2 whose viewer's side (display surface side) is shown at the top of FIG. 1, and a backlight device 3 disposed on the liquid crystal panel 2 on the non-display side (shown at the bottom of FIG. 1) to illuminate the liquid crystal panel 2. The liquid crystal panel 2 constitutes a display unit that displays the information.

The liquid crystal panel 2 includes a color filter substrate 4 and an active matrix substrate 5 constituting a pair of substrates, and polarizing plates 6 and 7 respectively provided on the color filter substrate 4 and the active matrix substrate 5 on the outer surfaces. A liquid crystal layer, which is not shown, is held between the color filter substrate 4 and the active matrix substrate 5. Also, a flat plate-shaped transparent glass material or transparent synthetic resin such as acrylic resin is used for the color filter substrate 4 and the active matrix substrate 5. A resin film such as TAC (triacetylcellulose) or PVA (polyvinyl alcohol) is used for the polarizing plates 6 and 7, which are respectively bonded to the color filter substrate 4 and the active matrix substrate 5 to cover at least the effective display region on the display surface of the liquid crystal panel 2.

The active matrix substrate 5 constitutes one of the pair of substrates. The active matrix substrate 5 has pixel electrodes, thin film transistors (TFT), and the like formed thereon between itself and the liquid crystal layer, which correspond to the plurality of pixels included on the display surface of the liquid crystal panel 2 (described in detail below). As described in detail below, the active matrix substrate 5 has a switching circuit (semiconductor device) of the present invention including the above-mentioned thin film transistor on a pixel by pixel basis. On the other hand, the color filter substrate 4 constitutes another substrate of the pair of substrates. The color filter substrate 4 has a color filter, an opposite electrode, and the like formed thereon between itself and the liquid crystal layer (not shown).

The liquid crystal panel 2 also has a FPC (Flexible Printed Circuit) 8 connected to a control device (not shown) that controls the driving of the liquid crystal panel 2. The liquid crystal layer is driven on a pixel by pixel basis to drive the display surface on a pixel by pixel basis and display desired images on the display surface.

Any liquid crystal mode and any pixel structure can be employed for the liquid crystal panel 2. Also, any driving mode can be used for the liquid crystal panel 2. That is, the liquid crystal panel 2 can be any liquid crystal panel that can display information. Therefore, in FIG. 1, the structure of the liquid crystal panel 2 is not shown in detail, and description of the structure is omitted.

The backlight device 3 includes a light-emitting diode 9 as a light source, and a light guide plate 10 disposed to face the light-emitting diode 9. In the backlight device 3, the light-emitting diode 9 and the light guide plate 10a are held in place while the liquid crystal panel 2 is disposed over the light guide plate 10 in a bezel 14 having an L-shaped cross section. The color filter substrate 4 has a case 11 disposed thereon. Thus, the backlight device 3 is attached to the liquid crystal panel 2, forming a transmissive liquid crystal display device 1 in which illumination light from the backlight device 3 is projected to the liquid crystal panel 2.

For the light guide plate 10, synthetic resin such as transparent acrylic resin, for example, is used, and light from a light-emitting diode 9 enters the light guide plate 10. A reflective sheet 12 is disposed on the light guide plate 10 on the side opposite from the liquid crystal panel 2 (on the opposite surface side). On the light guide plate 10, on the side facing the liquid crystal panel 2 (light-emitting surface side), optical sheets 13 composed of a lens sheet, a diffusion sheet, and the like are disposed. The optical sheets 13 convert the light originated from the light-emitting diode 9 and guided to a prescribed light guide direction (left to right in FIG. 1) through inside the light guide plate 10 into planar illumination light having a uniform luminance. The illumination light is then projected to the liquid crystal panel 2.

Although a configuration using the backlight device 3, which is edge-lit type and is equipped with the light guide plate 10, is described above, this embodiment is not limited to such. Alternatively, a direct lighting type backlight device may be used. A backlight device having a light source other than the light-emitting diode, such as a cold cathode fluorescent tube, may also be used.

Next, the liquid crystal panel 2 is described in detail with reference to FIG. 2 and FIG. 3.

Figure 2:
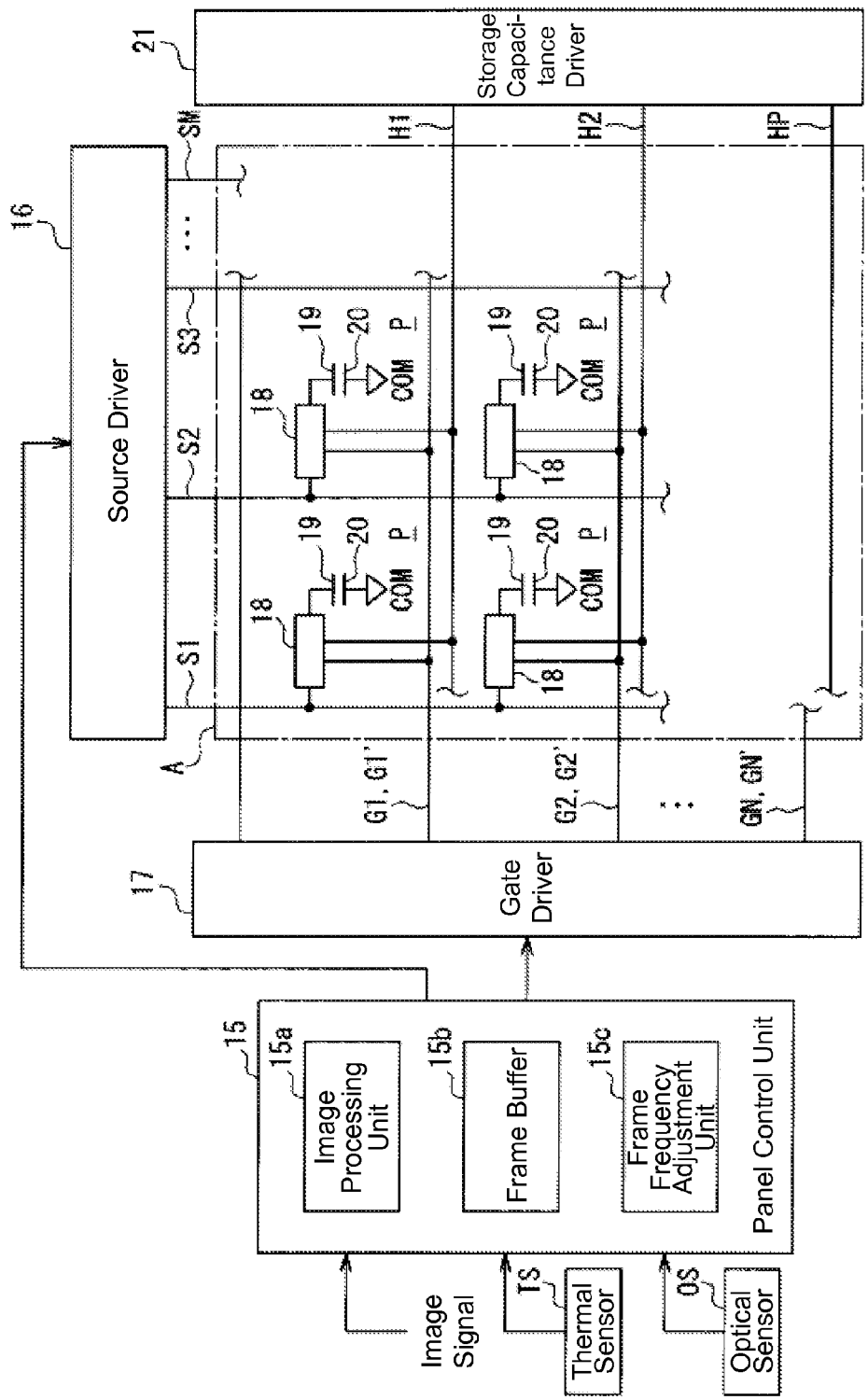
FIG. 2 illustrates the configuration of the liquid crystal panel shown in FIG. 1.

FIG. 2 illustrates the configuration of the liquid crystal panel shown in FIG. 1. FIG. 3 is a circuit diagram showing an equivalent circuit of the switching circuit shown in FIG. 2.

In FIG. 2, the liquid crystal display device 1 (FIG. 1) includes a panel control unit 15, which is the display control unit that controls the driving of the liquid crystal panel 2 (FIG. 1) serving as the display unit displaying information such as characters and images, and also a source driver 16 and a gate driver 17 that operate based on the instruction signals from the panel control unit 15. The liquid crystal display device 1 also includes a storage capacitance driver 21 that outputs a prescribed signal to a plurality of storage capacitances described below. Similar to the source driver 16 and the gate driver 17, the storage capacitance driver 21 operates based on the instruction signals from the panel control unit 15.

The panel control unit 15 is disposed in the above-mentioned control device, and into which the image signal from outside the liquid crystal display device 1 is inputted. Also, detection results sent from the thermal sensor TS detecting the ambient temperature of the liquid crystal panel 2 and detection results sent from the optical sensor OS detecting the intensity of the external light entering the liquid crystal panel 2 are inputted to the panel control unit 15. The thermal sensor TS and the optical sensor OS constitute a sensor that detects the condition of the surrounding environment of the liquid crystal panel (display unit) 2.

The panel control unit 15 includes an image processing unit 15a that performs prescribed image processing on the image signal inputted and generates various instruction signals for the source driver 16 and the gate driver 17; a frame buffer 15b that can store a frame worth of display data included in the image signal inputted; and a frame frequency adjustment unit 15c that adjusts the frame frequency of the display image displayed on the liquid crystal panel 2. The panel control unit 15 performs the drive control of the source driver 16 and the gate driver 17 according to the inputted image signal to display on the liquid crystal panel 2 the information according to the image signal.

The frame frequency adjustment unit 15c is configured to adjust the frame frequency based on the detection results sent from thermal sensor TS and the optical sensor OS and on the inputted image signal (described in detail below).

The source driver 16, gate driver 17, and storage capacitance driver 21 are disposed on the active matrix substrate 5. Specifically, the source driver 16 is disposed on the surface of the active matrix substrate 5 outside the effective display region A of the liquid crystal panel 2 as the display panel, along the horizontal direction of the liquid crystal panel 2. The gate driver 17 is disposed on the surface of the active matrix substrate 5 outside the effective display region A, along the vertical direction of the liquid crystal panel 2. The storage capacitance driver 21 is disposed on the surface of the active matrix substrate 5 outside the effective display region A to face the gate driver 17, along the vertical direction of the liquid crystal panel 2.

The source driver 16 and the gate driver 17 are driver circuits that drive a plurality of pixels P provided on the side of the liquid crystal panel 2 on a pixel by pixel basis. To the source driver 16 and the gate driver 17, a plurality of source electrode wirings S1 to SM (M is an integer of at least 2, hereinafter collectively referred to as "S") and a plurality of gate electrode wirings G1 to GN (N is an integer of at least 2, hereinafter collectively referred to as "G") are connected, respectively. The source electrode wirings S and the gate electrode wirings G respectively constitute the data wiring and the scan wiring, and are arranged in a matrix such that they cross each other on a transparent glass material or a transparent synthetic resin member (not shown) included in the active matrix substrate 5. That is, the source electrode wirings S are disposed on the above-mentioned member in parallel to the column direction of the matrix (in the vertical direction of the liquid crystal panel 2), and the gate electrode wirings G are disposed on the above-mentioned member in parallel to the row direction of the matrix (in the horizontal direction of the liquid crystal panel 2).

On the active matrix substrate 5, a plurality of bottom gate electrode wirings G1' to GN' (N' is an integer of at least 2, hereinafter collectively referred to as "G'") are disposed in parallel to the plurality of gate electrode wirings G1 to GN. Similar to the gate electrode wirings G, the bottom gate electrode wirings G' are connected to the gate driver 17, and supplies a prescribed bottom gate signal to the bottom gate electrode, which is described below. As the bottom gate signal, a signal different from the scan signal (gate signal) supplied to the gate electrode (to be described below) connected to the gate electrode wiring G, for example, is used.

Further, on the active matrix substrate 5, a plurality of storage capacitance common electrode wirings H1 to HP (P is an integer of at least 2, hereinafter collectively referred to as "H") are disposed in parallel to the plurality of gate electrode wirings G1 to GN. The storage capacitance common electrode wirings H are connected to the storage capacitance driver 21, and is configured to supply to the electrode (the other electrode) of each of the plurality of storage capacitances prescribed signals such as signals having a constant voltage or signals having a same phase.

In the proximity of the location where the source electrode wiring S intersects with the gate electrode wiring G and the bottom gate electrode wiring G', a switching circuit 18 for the pixel electrode (i.e., for the pixel driver circuit) using the semiconductor device of the present invention, and the above-mentioned pixels P having the pixel electrode 19 connected to the switching circuit 18 are disposed. At each of the pixels P, the common electrode 20 is disposed facing the pixel electrode 19, sandwiching the liquid crystal layer provided in the liquid crystal panel 2. That is, on the active matrix substrate 5, the switching circuit 18, the pixel electrode 19, and the common electrode 20 are disposed for each of the pixels.

Figure 3:
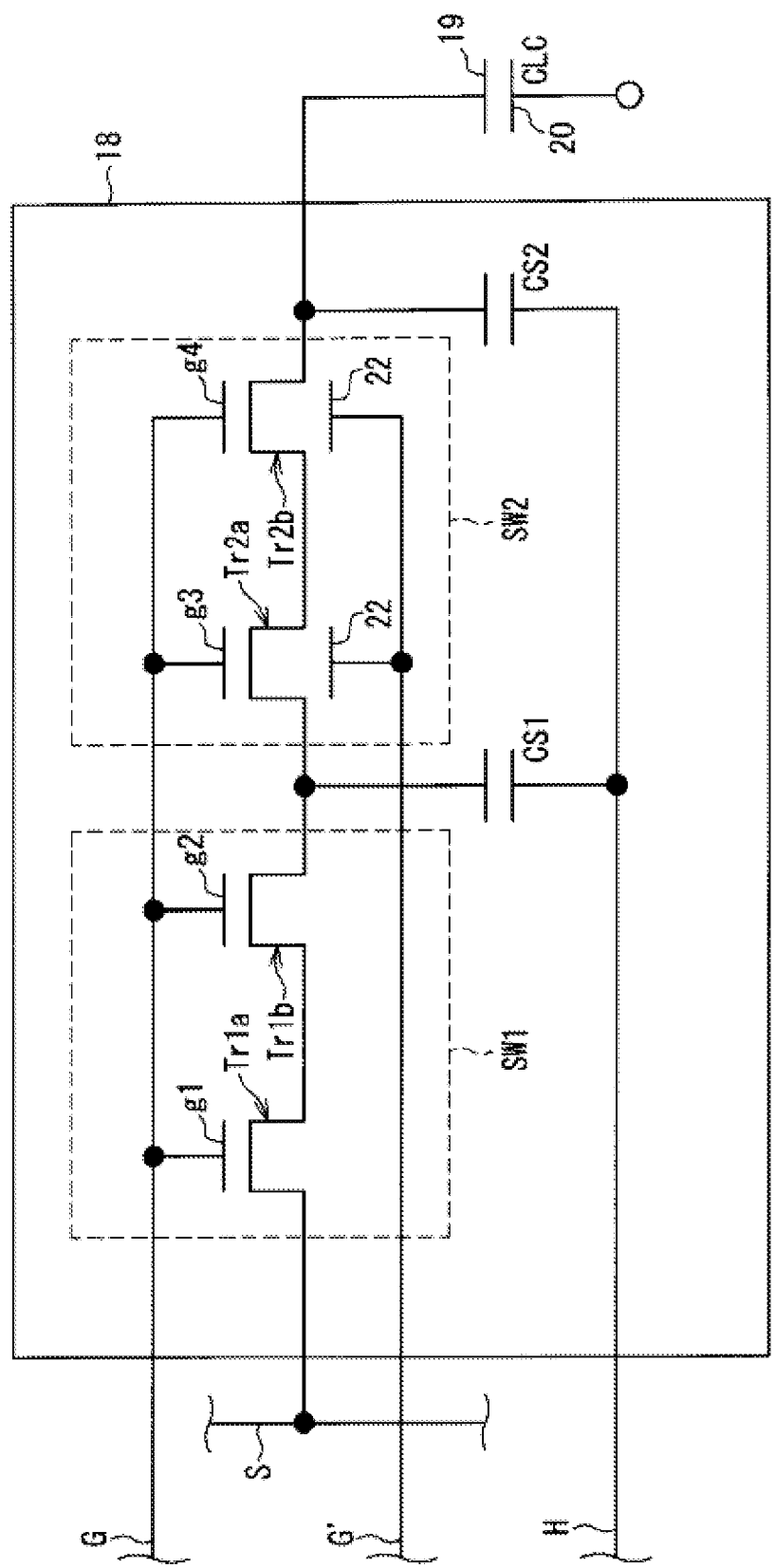
FIG. 3 is a circuit diagram showing an equivalent circuit of the switching circuit shown in FIG. 2.

As shown in FIG. 3, in the switching circuit 18, a plurality (two, for example) of switching units, a first switching unit SW1 and a second switching unit SW2, are connected in series to one another. In the first switching unit SW1, two thin film transistors Tr1a and Tr1b are connected in series to one another, and in the second switching unit SW2, two thin film transistors Tr2a and Tr2b are connected in series to one another. Each of the thin film transistors Tr1a, Tr1b, Tr2a, and Tr2b constitutes a switching element, and for each of the thin film transistors Tr1a, Tr1b, Tr2a, and Tr2b, a MIS (Metal-Insulator-Semiconductor) type transistor is used.

In the switching circuit 18, top gate electrodes of the thin film transistors Tr1a, Tr1b, Tr2a, and Tr2b, i.e., gate electrodes g1, g2, g3, and g4, are connected to the gate electrode wirings G. As the thin film transistors Tr2a and Tr2b of the second switching unit SW2, a double gate structure transistor including the top gate electrode (gate electrodes g3 and g4) and the bottom gate electrode 22 is used. The bottom gate electrode 22 is connected to the bottom gate electrode wiring G'. The bottom gate electrode 22 is configured into a single unit for the two gate electrodes g3 and g4. Further, the bottom gate electrode 22 also functions as a (lower) light-shielding film blocking the illumination light from the backlight device 3 (described in detail below).

In the switching circuit 18, an upper light-shielding film, which is described below, is provided to cover the first and the second switching units SW1 and SW2, so that light from outside the liquid crystal panel 2 (external light) can be blocked as much as possible from entering the first and the second switching units SW1 and SW2.

Also, in the switching circuit 18, at the connecting section of the first and the second switching units SW1 and SW2, and at one end of the switching circuit 18, the first and second capacitances, i.e., the first and second storage capacitances CS1 and CS2 are connected, respectively. That is, one of the electrodes of the first storage capacitance CS1 is connected to the connecting section of the first and second switching units SW1 and SW2. Also, one of the electrodes of the second storage capacitance CS2 is connected to the second switching unit SW2 on the side opposite from the above-mentioned connecting section. The other electrodes of the first and second storage capacitance CS1 and CS2 are connected to the storage capacitance common electrode wiring H. The first and second storage capacitances CS1 and CS2 are connected in parallel to each other.

The source electrode and the drain electrode of the switching circuit 18 are connected to the source electrode wiring S and to the pixel electrode 19, respectively. Also, a liquid crystal capacitance CLC is formed between the pixel electrode 19 and the common electrode 20. The liquid crystal capacitance CLC constitutes an external capacitance for the second switching unit SW2 and is connected in parallel to the second storage capacitance CS2.

Further, the switching circuit 18 is set to provide the optimum capacitance ratios of the first and second storage capacitance CS1 and CS2 in consideration of, among other factors, the size of the liquid crystal capacitance CLC, as described below. The switching circuit 18 is also configured to reliably suppress the voltage fluctuation at one end of the switching circuit 18, i.e., the pixel voltage fluctuation at the liquid crystal capacitance CLC.

Back in FIG. 2, on the active matrix substrate 5, in the respective regions defined by a matrix by the source electrode wiring S, and by the gate electrode wiring G and the bottom gate electrode wiring G', a plurality of regions of the pixels P are formed. These pixels P include red (R) pixels, green (G) pixels, and blue (B) pixels. These RGB pixels are arranged sequentially, for example, in this order, in parallel to the respective gate electrode wirings G1 to GN. Further, the RGB pixels can display corresponding colors through a color filter layer (not shown) provided on the color filter substrate 4.

On the active matrix substrate 5, a gate driver 17 sequentially outputs to the gate electrode wirings G1 to GN the scan signal (gate signal) that turns ON the gate electrodes g1 to g4 of the corresponding switching circuit 18 based on the instruction signal from the image processing unit 15a. When the gate driver 17 sends the signal to the gate electrode wirings G1 to GN, it also sequentially outputs the bottom gate signal to the bottom gate electrode wirings G1' to GN', which pair with the gate electrode wirings G1 to GN, for the bottom gate electrode 22 of the corresponding switching circuit 18.

When the gate electrode wirings G1 to GN, which pair with the storage capacitance common electrode wirings H1 to HP, receive their signal, the storage capacitance driver 21 sequentially supplies a signal of a constant voltage or signals of the same phase to the storage capacitance common electrode wirings H1 to HP based on the instruction signal from the image processing unit 15a, i.e., for the other electrodes of the first storage capacitance CS1 and the second storage capacitance CS2 of the corresponding switching circuit 18.

The source driver 16 outputs the data signal (voltage signal (gradation voltage)) according to the illumination of the display image (gradation) to the corresponding source electrode wirings S1 to SM based on the instruction signal from the image processing unit 15a.

The switching circuit 18 is described in detail below with reference to FIG. 4, FIG. 5(a), FIG. 5(b), and FIG. 5(c).

Figure 4:
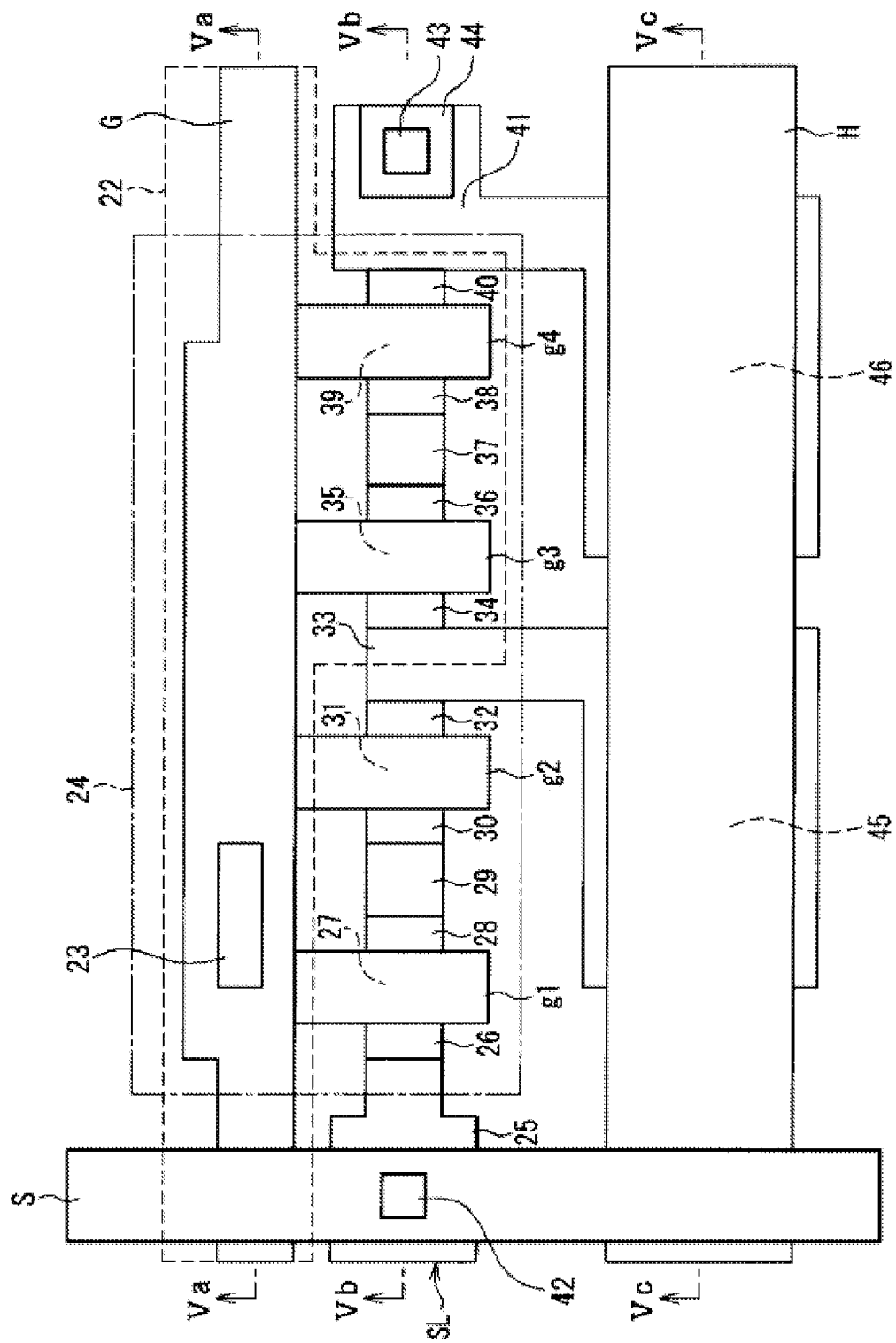
FIG. 4 is a plan view showing the configuration of the main part of the above-mentioned switching circuit.
Figure 5:
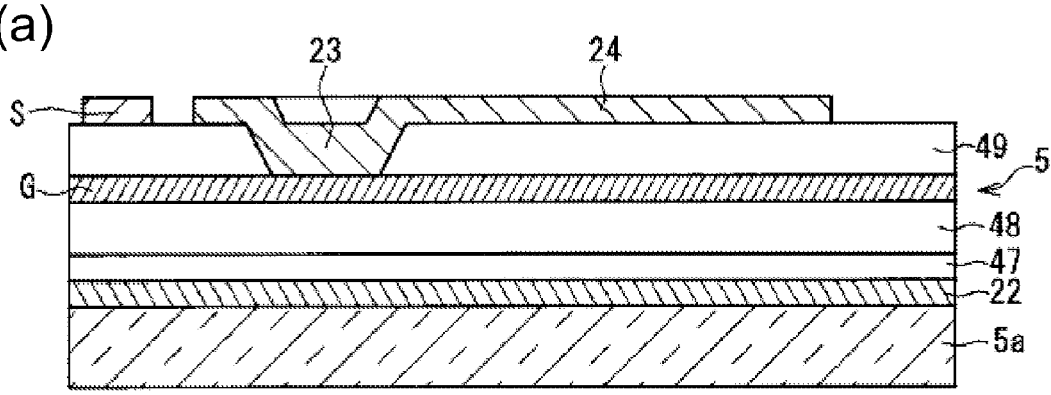
FIG. 5(a), FIG. 5(b), and FIG. 5(c) are cross-sectional views taken along the line Va-Va, line Vb-Vb, and line Vc-Vc, respectively, of FIG. 4.
Figure 5:
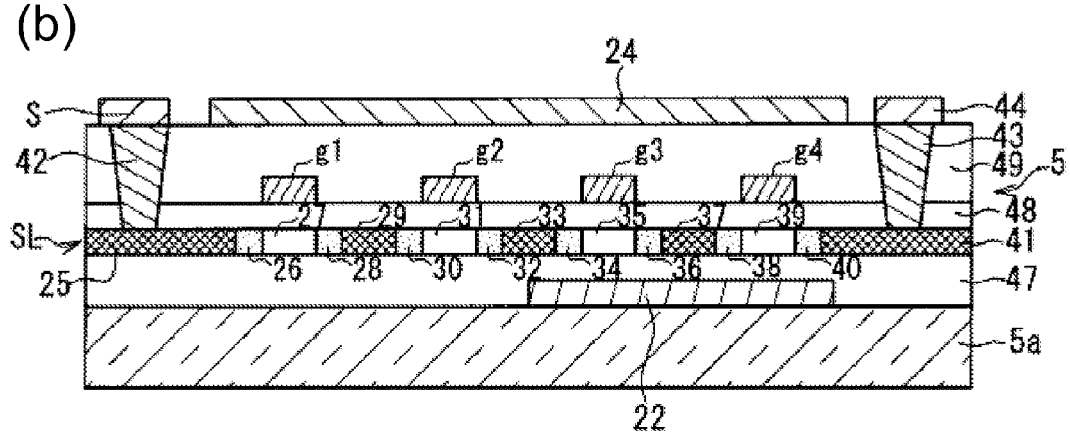
Figure 5:
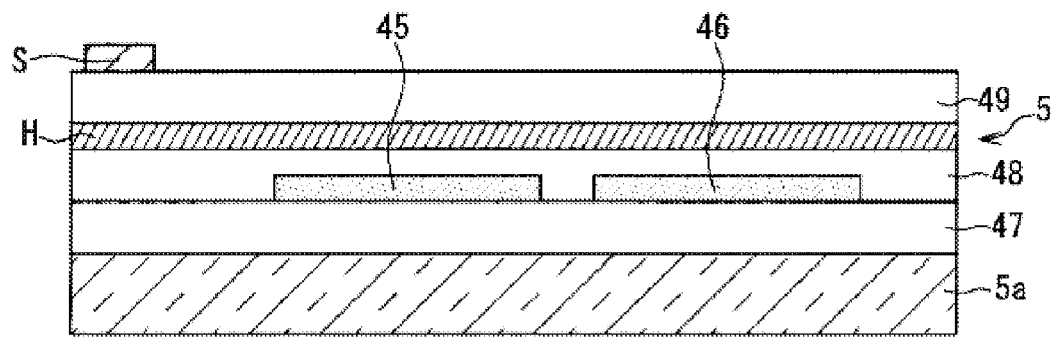

FIG. 4 is a plan view showing the configuration of the main part of the switching circuit. FIG. 5(a), FIG. 5(b), and FIG. 5(c) are cross-sectional views taken along the line Va-Va, line Vb-Vb, and line Vc-Vc of FIG. 4, respectively.

As shown in FIG. 4, in the switching circuit 18, the silicon layer SL, which is a semiconductor layer configured into the shape of approximately straight line, is disposed under the gate electrodes g1 to g4 connected to the gate electrode wiring G. Also in the switching circuit 18, as shown in FIG. 4 with dotted lines, the bottom gate electrode 22 is formed under the silicon layer SL. The bottom gate electrode 22 is arranged to overlap the gate electrode wiring G in the vertical direction of FIG. 4 (direction of the thickness of the active matrix substrate 5), and includes the linear portion constituting the bottom gate electrode wiring G' and a portion disposed under the gate electrodes g3 and g4 of the thin film transistors Tr2a and Tr2b in the second switching unit SW2 and serving as a lower light-shielding film that shields the thin film transistors Tr2a and Tr2b from the light.

Also in the switching circuit 18, as shown in FIG. 4 with the dashed-dotted line, an upper light-shielding film 24 is formed over the silicon layer SL. The upper light-shielding film 24 is disposed to cover the thin film transistors Tr1a, Tr1b, Tr2a, and Tr2b of the first and the second switching units SW1 and SW2. The upper light-shielding film 24 is electrically connected to the gate electrode wiring G through a contact 23.

In the silicon layer SL, a low concentration impurity region (LDD region: Lightly Doped Drain region) 45 for generating the first storage capacitance CS1 and a low concentration impurity region 46 for generating the second storage capacitance CS2 are provided. In the active matrix substrate 5, the low concentration impurity regions 45 and 46 are disposed both under the storage capacitance common electrode wiring H to generate a prescribed storage capacitance.

As shown in FIG. 5(a) to FIG. 5(c), in the active matrix substrate 5, the switching circuit 18 is disposed for each pixel over the substrate main body 5a made of a glass substrate. As shown in FIG. 5(a) and FIG. 5(b), in the switching circuit 18, the bottom gate electrode 22 is formed on the substrate main body 5a. Also in the switching circuit 18, a base insulating film 47 is formed to cover the bottom gate electrode 22 and the substrate main body 5a, and on the base insulating film 47, a silicon layer SL is provided. Also in the switching circuit 18, a gate insulating film 48 is formed to cover the silicon layer SL and the base insulating film 47, and the gate electrodes g1 to g4 are formed on the gate insulating film 48.

On the switching circuit 18, the source electrode and the drain electrode 44 formed in the source electrode wiring S are disposed on the interlayer film 49 formed to cover the gate electrodes g1 to g4. The source electrode is connected to a source region 25 provided in the silicon layer SL through a contact hole 42, and the drain electrode 44 is connected to a drain region 41 provided in the silicon layer SL through a contact hole 43.

Also in the switching circuit 18, the thin film transistors Tr1a, Tr1b, Tr2a, and Tr2b are N-type transistors. That is, in the silicon layer SL, high concentration regions (indicated with the cross hatching in FIGS. 5) 25, 29, 33, 37, and 41 into which N-type impurity such as phosphorus is implanted at a high concentration, low concentration impurity regions (LDD region, indicated in FIG. 5 with dots) 26, 28, 30, 32, 34, 36, 38, 40, 45, and 46 into which N-type impurity is implanted at a low concentration, and channel regions 27, 31, 35, and 39 respectively formed under the gate electrodes g1 to g4 are provided.

As shown in FIG. 5(b), in the switching circuit 18, the bottom gate electrode 22 is disposed under the silicon layer SL, extending from the middle point of the high concentration region 33 to the edge of the drain region 41. That is, as described above, the bottom gate electrode 22 is formed only under the thin film transistors Tr2a and Tr2b of the second switching unit SW2. Also, as described in detail below, the bottom gate electrode 22 is made of an opaque electrode material, and the bottom gate electrode 22 is configured to double as a (lower) light-shielding film that prevents the light from the bottom side of FIG. 5(b), such as the illumination light from the backlight device 3, from entering the low concentration impurity regions 34, 36, 38, and 40 and the channel regions 35 and 39. Thus, in the switching circuit 18, leakage current due to the illumination light can be suppressed at the second switching unit SW2.

Further, in the switching circuit 18, the upper light-shielding film 24 is provided on the interlayer film 49 such that it is in the same layer with the source electrode and the drain electrode 44. As shown in FIG. 5(b), the upper light-shielding film 24 is disposed between the source electrode and the drain electrode 44, over the gate electrodes g1 to g4, to shield the low concentration impurity regions 26, 28, 30, 32, 34, 36, 38, and 40 and the channel regions 27, 31, 35, and 39 from the light. That is, the upper light-shielding film 24 can prevent the light from the top side of the FIG. 5(b) from entering the low concentration impurity regions 26, 28, 30, 32, 34, 36, 38, and 40 and the channel regions 27, 31, 35, and 39.

Here, a method of manufacturing the switching circuit 18 is described in detail.

In FIG. 5(a) to FIG. 5(c), the bottom gate electrode 22 is formed by depositing a metal such as molybdenum or tungsten on the substrate main body 5a, and then conducting a patterning by photolithography and etching. Specifically, the film thickness of the bottom gate electrode 22 is approx. 100 to 200 nm.

Next, the base insulating film 47 is formed by forming a SiN film and a $SiO_2$ film, for example, sequentially by CVD (Chemical Vapor Deposition) to the thickness of 100 nm each. Then, over the base insulating film 47, an amorphous silicon film is formed to the thickness of 50 nm, which is then converted to a polysilicon through the laser crystallization. Next, boron is doped into the polysilicon as the channel dope for threshold adjustment.

Next, over the polysilicon, a $SiO_2$ film is formed to the thickness of 80 nm as a gate insulating film 48, and over the gate insulating film 48, a film of metal such as molybdenum or tungsten is deposited and then patterned to form the gate electrodes g1 to g4. Using the gate electrodes g1 to g4 as masks, N-type impurity, such as phosphorus is doped at a low concentration to form low concentration impurity regions 26, 28, 30, 32, 34, 36, 38, and 40. Next, a photoresist for securing the regions of the low concentration impurity regions 26, 28, 30, 32, 34, 36, 38, and 40 (LDD length) is formed, and then phosphorus is doped to form the source region 25, drain region 41, and high concentration regions 29, 33, and 37.

Here, the doping amount in the low concentration impurity regions 26, 28, 30, 32, 34, 36, 38, and 40 is adjusted to obtain a sheet resistance of about 50 kΩ to 150 kΩ ($1 \times 10^{13}$ to $10^{14}/cm^2$, for example). This doping amount is doped to cancel out the P-type impurity (boron) doped earlier for channel doping in forming the N-type low concentration impurity regions 26, 28, 30, 32, 34, 36, 38, and 40. In the source region 25, drain region 41, and the high concentration regions 29, 33, and 37, phosphorus is doped at about $1 \times 10^{15}/cm^2$ to keep the sheet resistance to no more than 1 kΩ. Then, a heat treatment is conducted for 1 hour at 500° C. to 600° C. to activate the impurity. Alternatively, for a shorter heat treatment time, heat treatment may be conducted for a few minutes using a lamp annealing device at 650° C. to 700° C.

Next, a $SiO_2$ film and a SiN film are formed to a thickness of about 100 nm to 300 nm each as an interlayer film 49. Contact holes 42 and 43 are formed for connection to the source electrode and the drain electrode 44, respectively. The source electrode, the drain electrode 44, and metal for wiring, i.e., Al or Al alloy, for example, or a film made by laminating them are deposited and patterned.

Lastly, although not shown in the figures, to form a pixel electrode 19 of the liquid crystal display device 1, a planarizing film made of resin or the like is formed after wirings are formed. On the planarizing film, a transparent electrode (ITO, for example) that will be the pixel electrode 19 is formed. In some cases, a reflective electrode is formed of Al, Ag, or its alloys on the ITO.

In the description above, a formation method when the thin film transistors Tr1a, Tr1b, Tr2a, and Tr2b are constituted of N-type transistors is described. However, when the thin film transistors Tr1a, Tr1b, Tr2a, and Tr2b are to be constituted of P-type transistors, P-type impurity such as boron is used to form the source region 25 and the drain region 41. Also, because the driver circuits around the panel can also be formed according to the formation method described above, the switching circuit 18 of this structure can be applied to a switching element or the like that is required to have a low leakage current.

Figure 6:
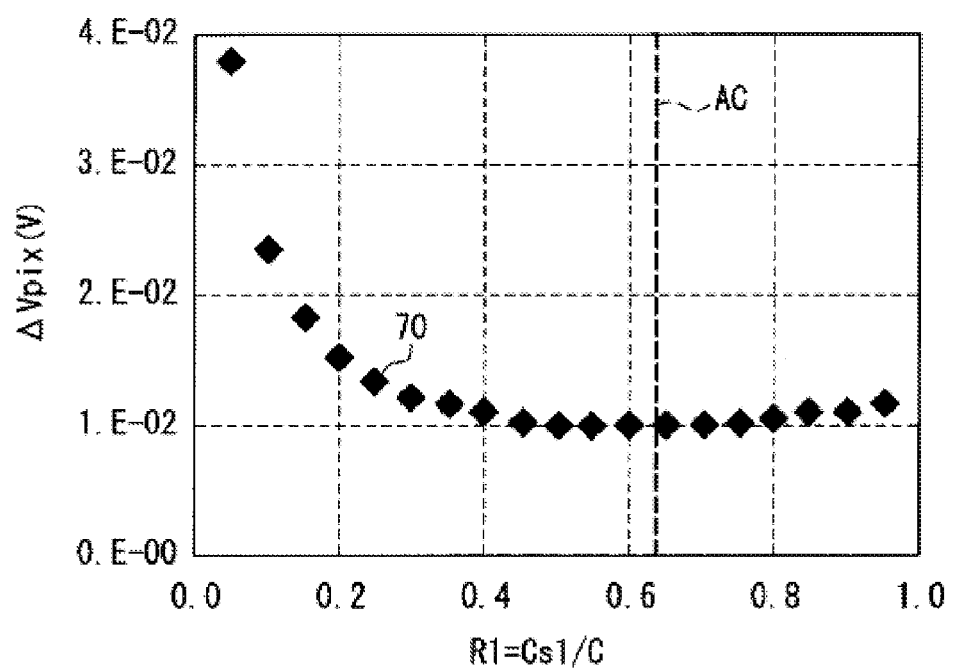
FIG. 6 is a graph showing the relationship between the optimum capacitance ratio of the above-mentioned switching circuit and the pixel voltage fluctuation.

Next, with reference to FIG. 6, reduction in the pixel voltage fluctuation as an effect of the optimization of the capacitance ratios of the first and the second storage capacitance CS1 and CS2 in the switching circuit 18 is described in detail.

FIG. 6 is a graph showing the relationship between the optimum capacitance ratio and the pixel voltage fluctuation in the switching circuit.

In the switching circuit 18 according to this embodiment, the capacitance ratios R1 and R2 of the first and the second storage capacitances CS1 and CS2 are set to satisfy Equation (2) and Equation (3) below. Thus, in the switching circuit 18 according to this embodiment, the capacitance ratios R1 and R2 of the first and second storage capacitances CS1 and CS2 are optimized, and therefore the pixel voltage fluctuation can reliably be suppressed.

Specifically, the inventor of the present invention found that when the voltage Vds between one end and the other end of the second switching unit SW2 is between 0V and 1V, the leakage current Ioff of the second switching unit SW2 can be obtained from Equation (1) below. Further, the inventor of the present invention found that, based on an approximate equation of Equation (1), the capacitance values Cs1 and Cs2 of the first and the second storage capacitances CS1 and CS2 that minimize the (voltage) fluctuation ΔVpix of the pixel voltage Vpix, which is caused by the leakage current, can be expressed by Equation (A) and Equation (B) below. Further, the inventor of the present invention found that, based on Equation (A) and Equation (B), and the plots 70 in FIG. 6, the optimum capacitance ratios R1 and R2 of the first and second storage capacitances CS1 and CS2 can respectively be expressed in Equation (2) and Equation (3) below.

$$Ioff = Io \times Vds^n \quad (1)$$

$$Cs1 = n/(n+1) \times (C + Cv) \quad (A)$$

$$Cs2 = 1/(n+1) \times (C - n \times Cv) \quad (B)$$

$$R1 = \{n/(n+1)\} \times \{(C + Cv)/C\} \pm 0.2 \quad (2)$$

$$R2 = \{1/(n+1)\} \times \{(C - n \times Cv)/C\} \pm 0.2 \quad (3)$$

where Io is the leakage current when Vds=1(V); n=0.7 to 0.8; Cs1:Cs2=R1:R2; R1+R2=1; Cs1+Cs2=C; and Cv is the capacitance value of the external capacitance connected to the second switching unit SW2 in parallel with the second storage capacitance CS2, i.e., the capacitance value of the liquid crystal capacitance CLC.

When n=0.73, C=200(fF), Cv=100(fF) in Equation (A) and Equation (B), values subjected to ±0.2 in Equation (2) and Equation (3) above are R1=0.63 and R2=0.37, respectively, which are the optimum values. Further, from plots 70 showing the relationship between R1 and the fluctuation ΔVpix and the optimum condition AC (=0.63), the range with the smallest increase in fluctuation ΔVpix was determined to be ±0.2 in Equation (2) and Equation (3).

Also, in the switching circuit 18 according to this embodiment, leakage current at the first and second switching units SW1 and SW2 is significantly reduced, and the fluctuation ΔVpix of the pixel voltage Vpix becomes small, as indicated by plots 70. Therefore, in the switching circuit 18 according to this embodiment, the frame frequency adjustment unit 15c can adjust the frame frequency to a prescribed frequency (10 Hz, for example) or lower in accordance with the image signal inputted.

Specifically, according to the calculation by the inventor of the present invention, in the switching circuit 18 of this embodiment, when n=0.73, C=200(fF), and Cv=100(fF), the time during which the fluctuation ΔVpix is 10 mV (i.e., the time during which the voltage is maintained at the liquid crystal capacitance CLC) is 437 ms. Therefore, in the switching circuit 18 of this embodiment, the lowest frame frequency may be set to 2.3 Hz. However, this frame frequency is the result of the calculation based on the leakage current when the ambient temperature of the liquid crystal panel 2 (switching circuit 18) is 40° C. Therefore, in the actual switching circuit 18, the frame frequency adjustment unit 15c needs to set the minimum frame frequency in consideration of the increase in leakage current due to the rise in the ambient temperature and the stray light.

As described above, the frame frequency adjustment unit 15c is configured to adjust the frame frequency based on the detection results sent from the thermal sensor TS and the optical sensor OS, and the image signal inputted. That is, in the first and second switching units SW1 and SW2, the leakage current fluctuates depending on the operation environment of the liquid crystal panel 2, i.e., the ambient temperature and the external light. Therefore, the frame frequency adjustment unit 15c is configured to determine the leakage current of the first and second switching units SW1 and SW2 based on the detection results sent from the thermal sensor TS and the optical sensor OS, and is also configured to adjust the frame frequency so that the display images on the liquid crystal panel 2 do not fluctuate. The frame frequency adjustment unit 15c is also configured to adjust the frame frequency to the prescribed frequency or lower when the display image (image signal) is a still picture, and to adjust the frame frequency to the second prescribed frequency (50 Hz, for example) or higher when the display image is a motion picture.

In the switching circuit (semiconductor device) 18 according to this embodiment configured as described above, a signal of a constant voltage or signals of the same phase is supplied to the other electrodes of the first and second storage capacitances (capacitances) CS1 and CS2. Thus, voltages at the first and second switching units SW1 and SW2, which are connected in series to each other, can be set to the same voltage, and the leakage current caused by the voltage difference between one end and the other end of the first switching unit SW1 and of the second switching unit SW2 can be prevented. Also, a bottom gate electrode (lower light-shielding film) 22 and an upper light-shielding film 24 are formed at least for the second switching unit SW2, among the first switching unit SW1 and at the second switching unit SW2, which has the storage capacitances CS1 and CS2 connected on the respective sides. This way, light-induced leakage current can be prevented from occurring at the second switching unit SW2. As a result, a switching circuit (semiconductor device) 18 can, unlike the conventional example described above, reliably suppress the leakage current even when a plurality of switching units are connected in series and a capacitance is connected to the connecting section of the switching units, and can suppress the voltage fluctuations at one end of the plurality of switching units.

In this embodiment, in the second switching unit SW2, the thin film transistors Tr2a and Tr2b are double-gate structure transistors. Therefore, according to this embodiment, the current drive force of the second switching unit SW2 (ON current) can easily be increased. Also, because the ON current can easily be increased, according to this embodiment, the liquid crystal capacitance CLC can easily be charged more rapidly.

In this embodiment, because the first storage capacitance CS1 and the second storage capacitance CS2 are connected parallel with each other, the areas of the first storage capacitance CS1 and the second storage capacitance CS2 can be reduced. Consequently, a compact switching circuit (semiconductor device) 18 can easily be configured.

In this embodiment, the switching circuit (semiconductor device) 18, in which the leakage current is reliably suppressed even when a plurality of switching units are connected in series to one another and a capacitance is connected to a connecting section of the switching units, and the voltage fluctuation at one end of the plurality of switching units is suppressed, is used. As a result, an active matrix substrate 5 and a liquid crystal display device (display device) 1 featuring a high performance and low power consumption can easily be configured.

Also in this embodiment, because the liquid crystal panel 2 is used as the display unit, the fluctuation in the pixel voltage at the liquid crystal capacitance CLC of the liquid crystal panel 2, which is provided on one end of the switching circuit 18, a liquid crystal display device 1 featuring a high display performance can easily be configured. Also in this embodiment, because the leakage current can reliably be suppressed to reduce the pixel voltage fluctuation, the frame frequency at the liquid crystal panel 2 can significantly be reduced. Therefore, power consumption of the liquid crystal display device 1 can easily be reduced.

In this embodiment, because the frame frequency adjustment unit 15c is configured to adjust the frame frequency based on the detection results sent from the thermal sensor TS and the optical sensor OS and the inputted image signal, the frame frequency adjustment unit 15c can appropriately adjust the frame frequency of display images displayed on the liquid crystal panel (display unit) 2. As a result, a liquid crystal display device 1 featuring a high display performance can easily be configured.

In this embodiment, because the frame frequency adjustment unit 15c adjusts the frame frequency to a prescribed frequency or lower in accordance with the image signal inputted, the power consumption of the liquid crystal panel (display unit) 2 and the liquid crystal display device 1 can be reduced.

Embodiment 2

Figure 7:
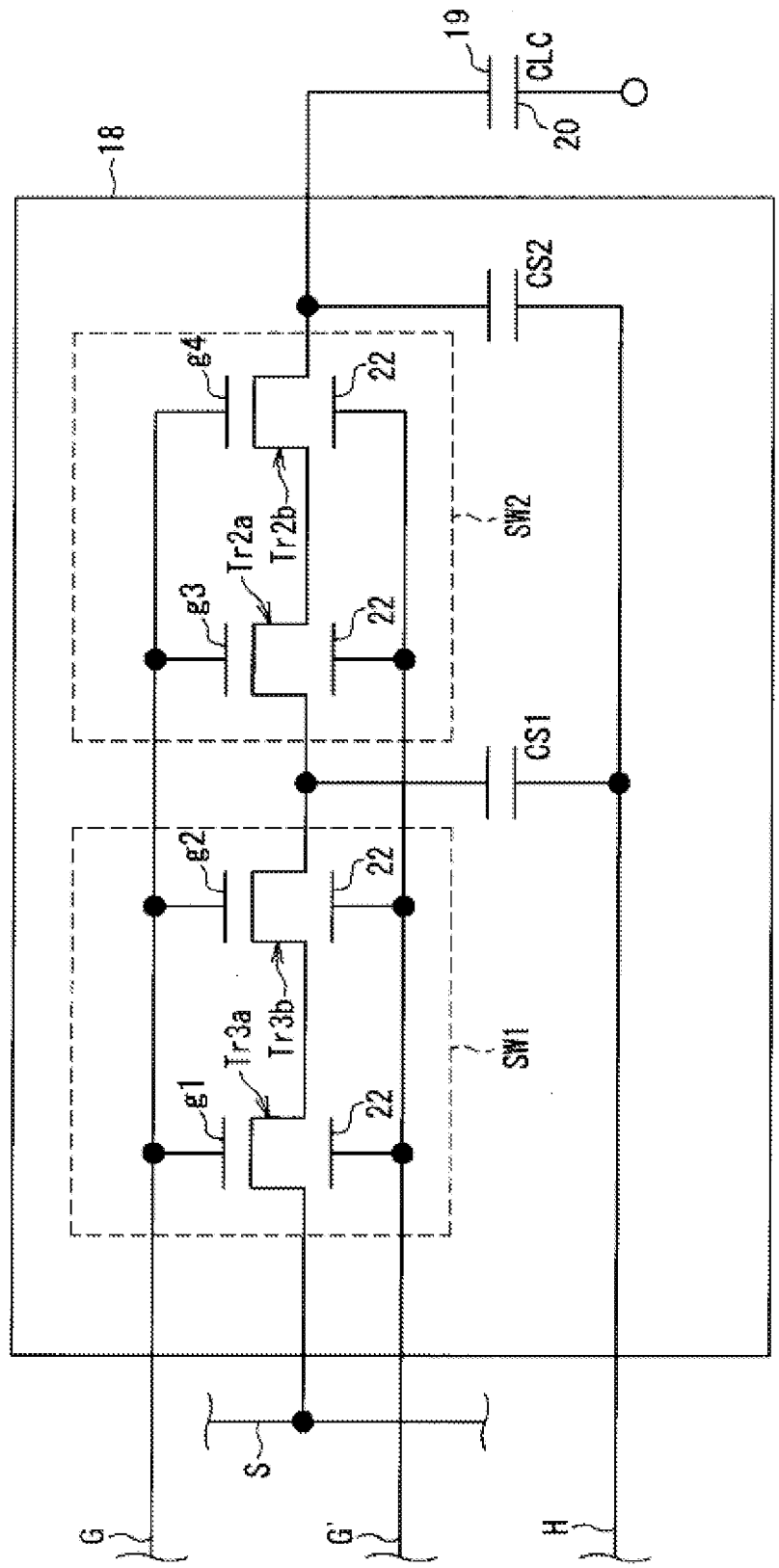
FIG. 7 is a circuit diagram showing an equivalent circuit of a switching circuit according to Embodiment 2 of the present invention.
Figure 8:
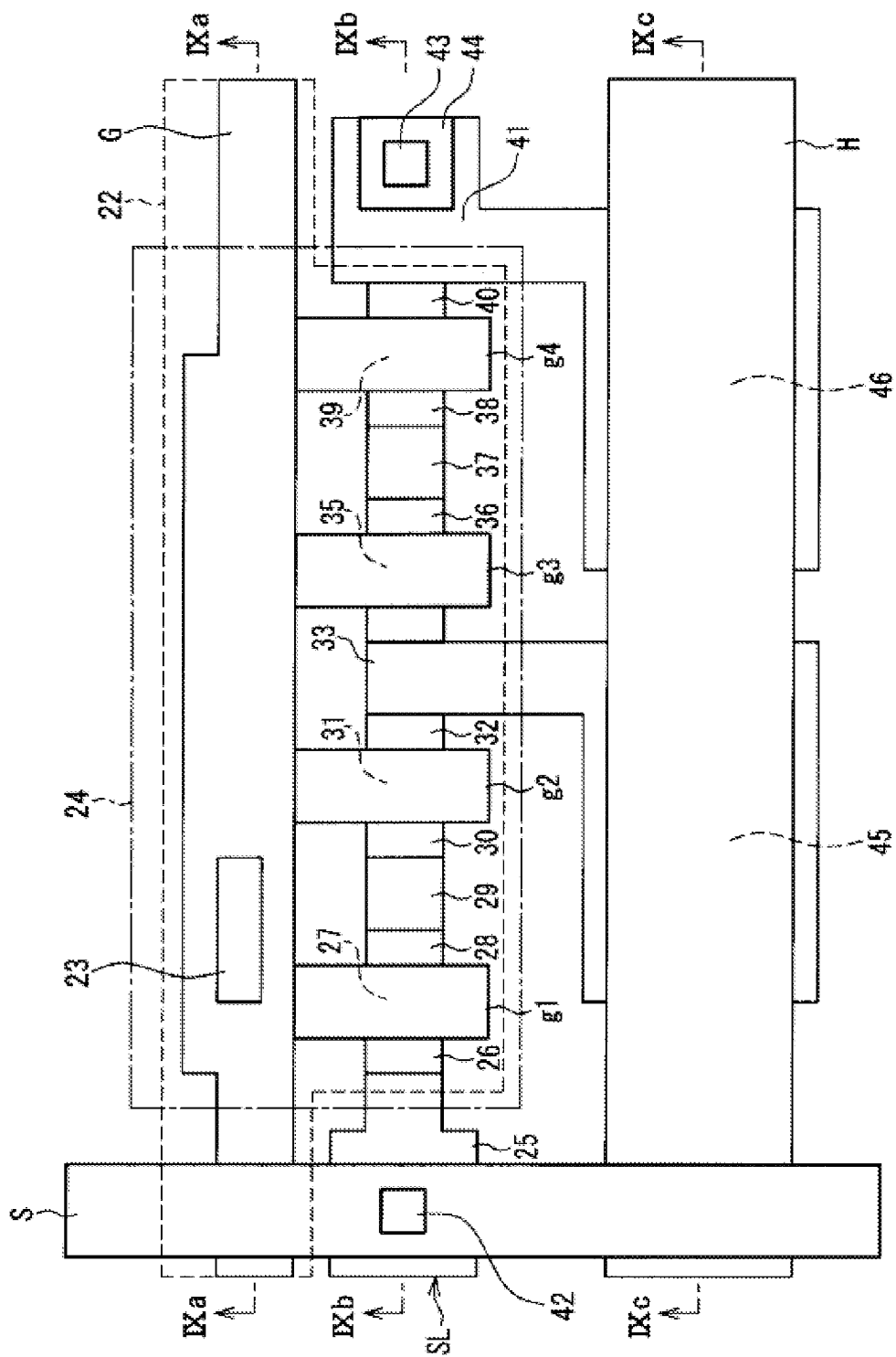
FIG. 8 is a plan view showing the configuration of the main part of the switching circuit shown in FIG. 7.
Figure 9:
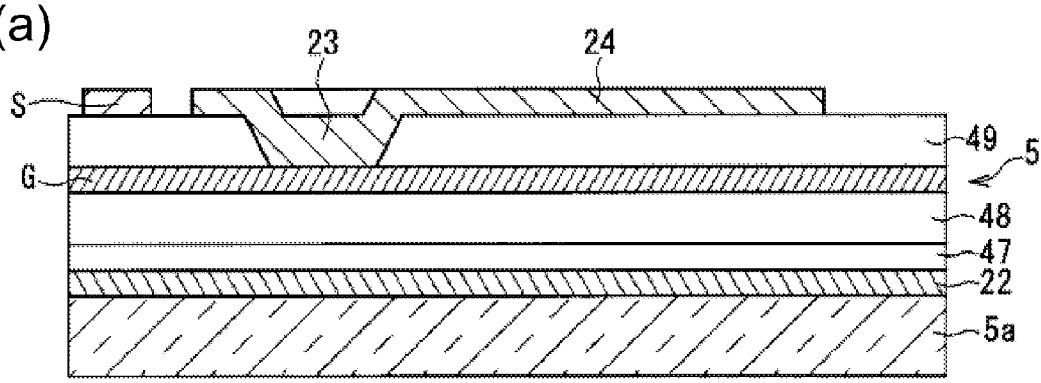
FIG. 9(a), FIG. 9(b), and FIG. 9(c) are cross-sectional views taken along the line IXa-IXa, line IXb-IXb, and line IXc-IXc, respectively, of FIG. 8.
Figure 9:
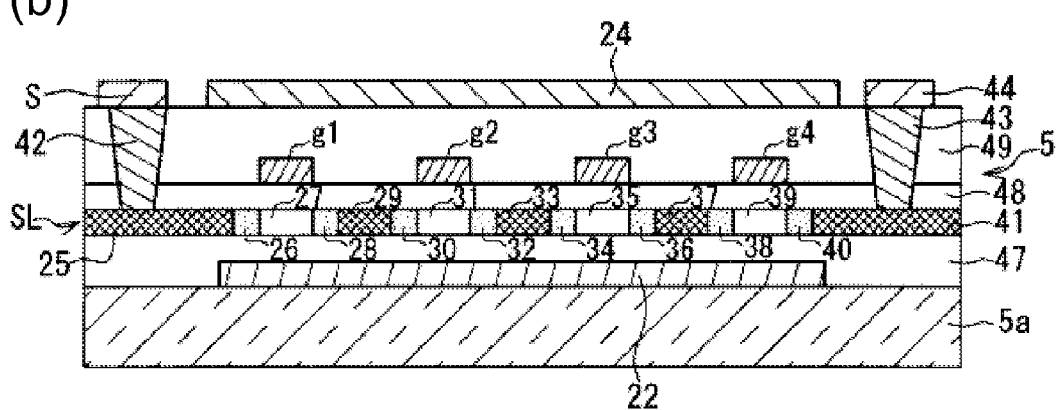
Figure 9:
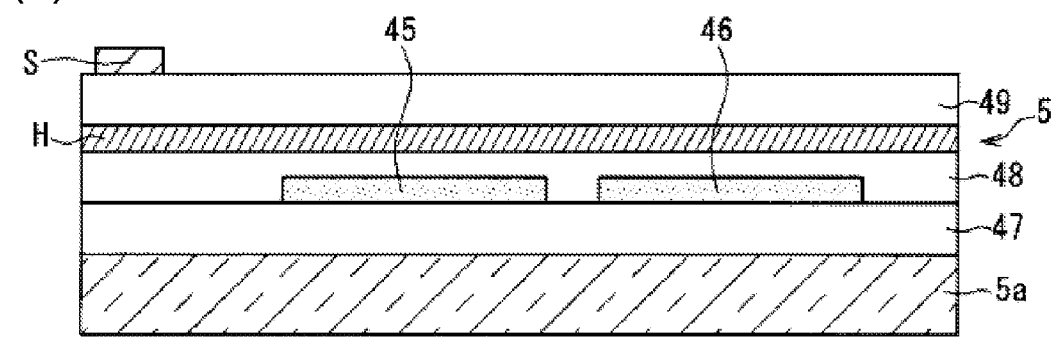

FIG. 7 is a circuit diagram showing an equivalent circuit of a switching circuit according to Embodiment 2 of the present invention. FIG. 8 is a plan view showing the configuration of the main part of the switching circuit shown in FIG. 7. FIG. 9(a), FIG. 9(b), and FIG. 9(c) are cross-sectional views taken along the line IXa-IXa, line IXb-IXb, and line IXc-IXc, respectively, of FIG. 8. As shown in the figures, the main difference between this embodiment and Embodiment 1 described above is that, in this embodiment, the thin film transistor (switching element) included in the first switching unit is a double gate structure transistor. For elements common to Embodiment 1, same reference characters are used and redundant descriptions are omitted.

That is, as shown in FIG. 7, in the switching circuit 18 according to this embodiment, thin film transistors Tr3a and Tr3b of the first switching unit SW1 are double gate structure transistors. Specifically, the thin film transistor Tr3a and Tr3b respectively include gate electrodes g1 and g2, and also include a bottom gate electrode 22.

Also, as shown in FIG. 8, FIG. 9(a), FIG. 9(b), and FIG. 9(c), in the switching circuit 18 according to this embodiment, the bottom gate electrode 22 is essentially one electrode unitarily formed for the four gate electrodes g1 to g4, and, like in Embodiment 1, it also functions as the (lower) light-shielding film blocking the illumination light from the backlight device 3. That is, as shown in FIG. 9(b), the bottom gate electrode 22 is formed under the silicon layer SL, between an edge of the source region 25 and an edge of the drain region 41, blocking the light projected from the bottom side of FIG. 9(b), which is the illumination light from the backlight device 3, for example, from entering the low concentration impurity regions 26, 28, 30, 32, 34, 36, 38, and 40 and the channel regions 27, 31, 35, and 39.

With the configuration described above, this embodiment can provide the functions and effects similar to those of Embodiment 1. Also in this embodiment, because all thin film transistors Tr3a, Tr3b, Tr2a, and Tr2b of the first switching unit SW1 and the second switching unit SW2 are double gate structure transistors, in the switching circuit (semiconductor device) 18 of this embodiment, the current drive force (ON current) can easily be increased and the charge time of the liquid crystal capacitance CLC can more easily be reduced.

Embodiment 3

Figure 10:
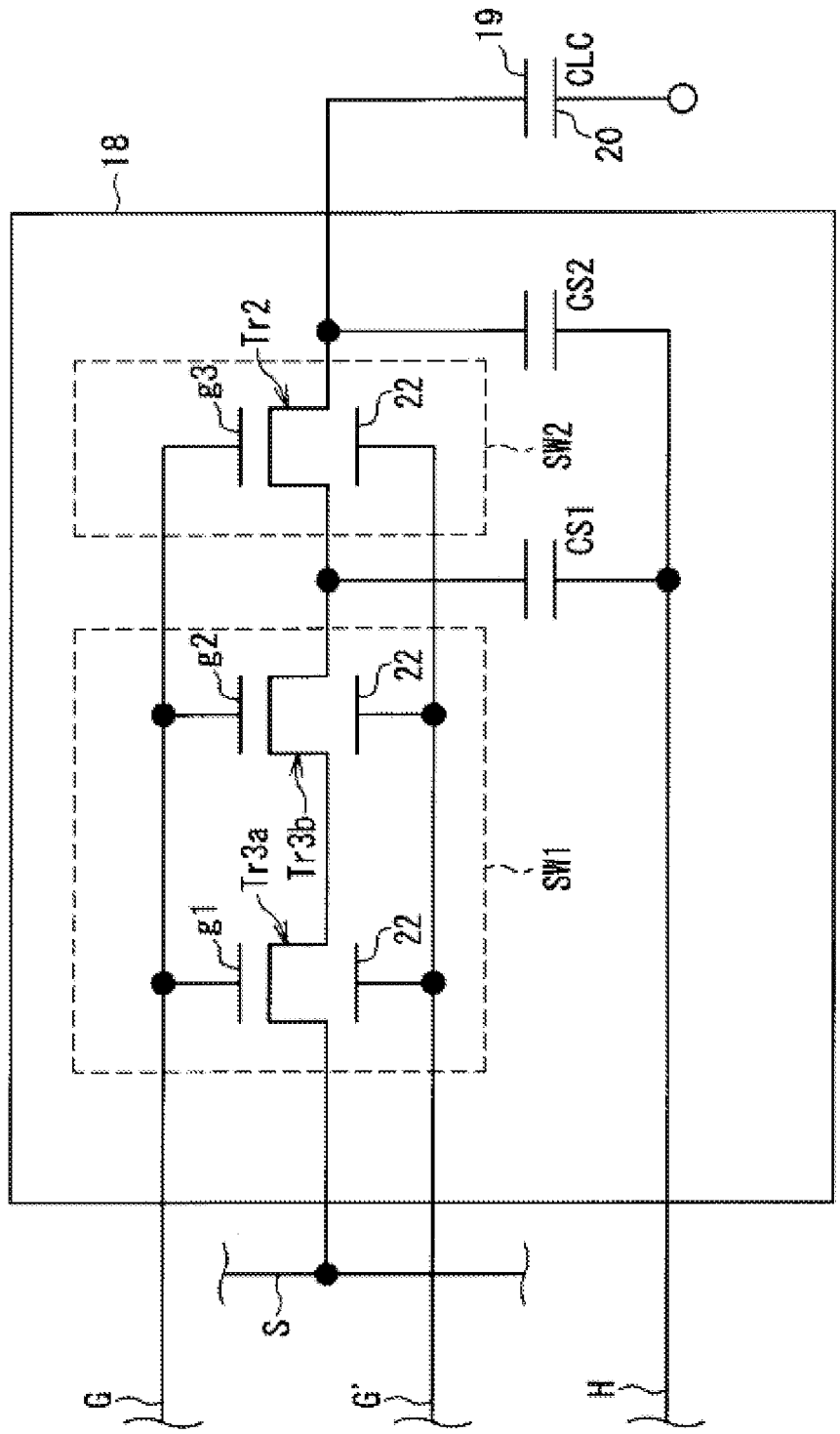
FIG. 10 is a circuit diagram showing an equivalent circuit of a switching circuit according to Embodiment 3 of the present invention.
Figure 11:
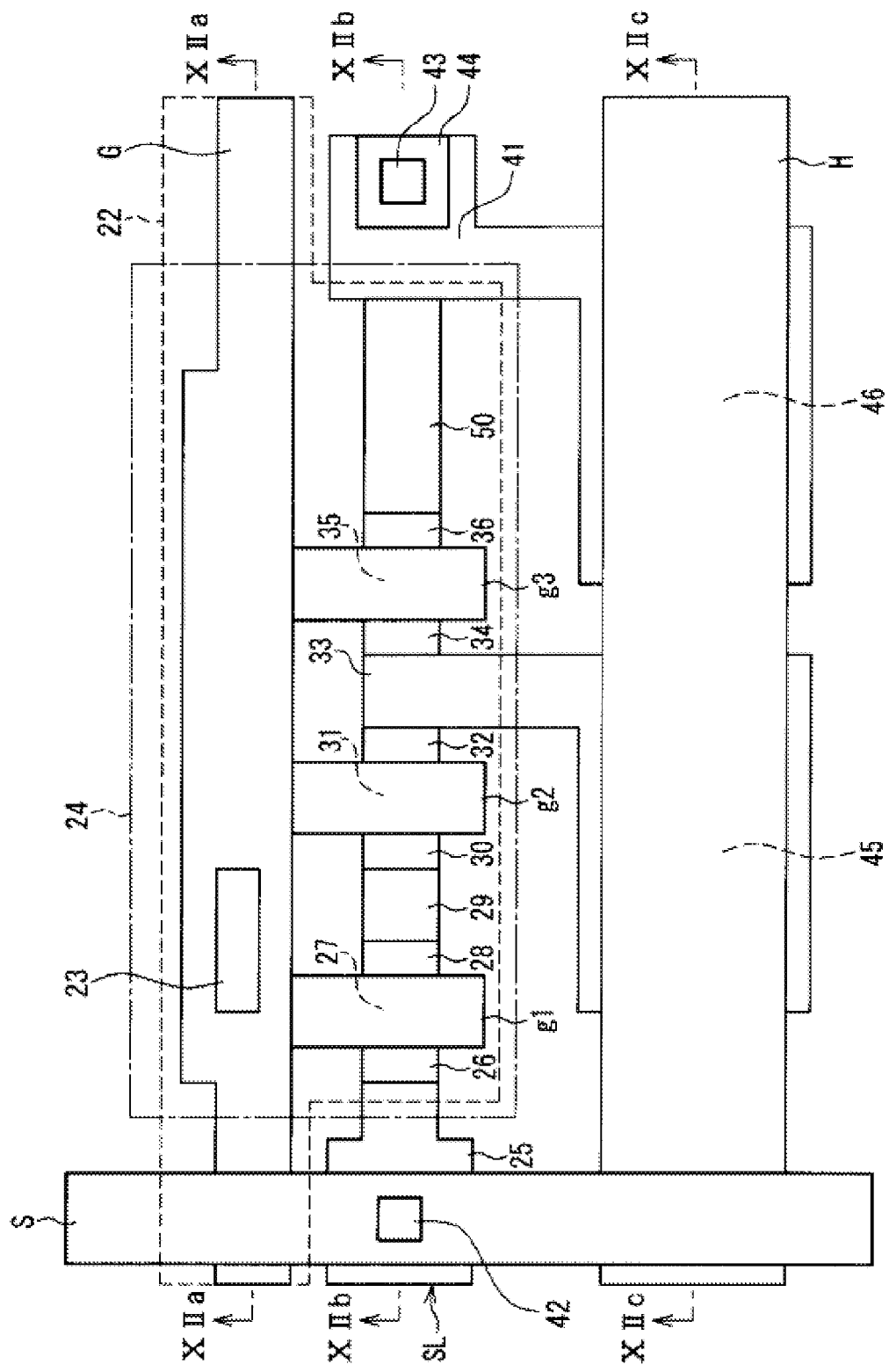
FIG. 11 is a plan view showing the configuration of the main part of the switching circuit shown in FIG. 10.
Figure 12:
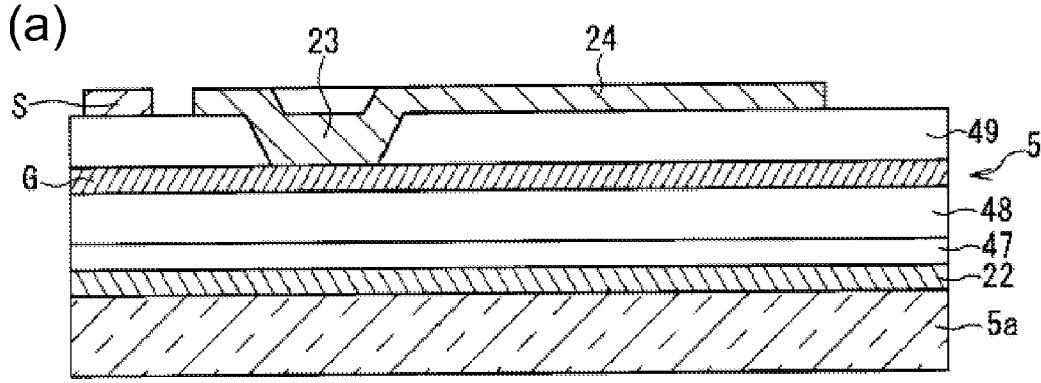
FIG. 12(a), FIG. 12(b), and FIG. 12(c) are cross-sectional views taken along the line XIIa-XIIa, line XIIb-XIIb, and line XIIc-XIIc, respectively, of FIG. 11.
Figure 12:
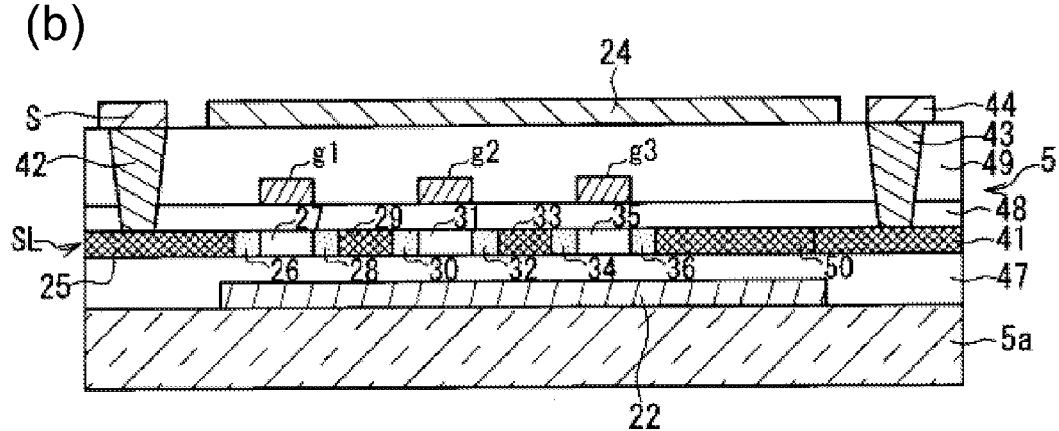
Figure 12:
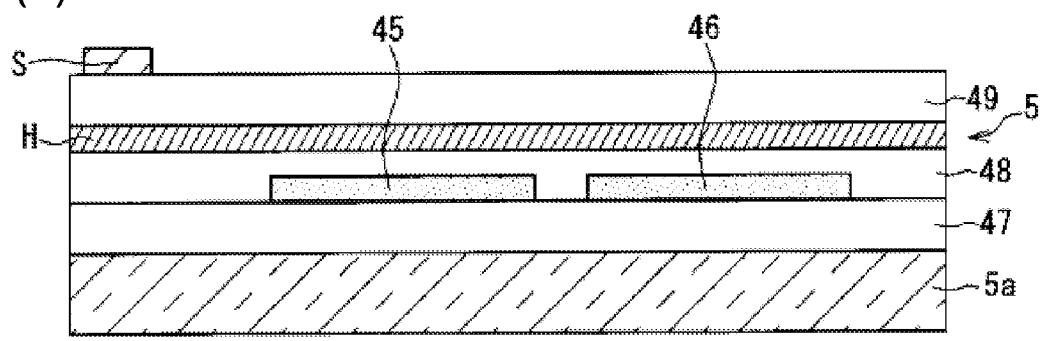

FIG. 10 is a circuit diagram showing an equivalent circuit of a switching circuit according to Embodiment 3 of the present invention. FIG. 11 is a plan view showing the configuration of the main part of the switching circuit shown in FIG. 10. FIG. 12(a), FIG. 12(b), and FIG. 12(c) are cross-sectional views taken along the line XIIa-XIIa, line XIIb-XIIb, and line XIIc-XIIc, respectively, of FIG. 11. As shown in the figures, the main difference between this embodiment and Embodiment 2 is that, in this embodiment, the number of thin film transistors (switching elements) included in the second switching unit is one. For elements common to Embodiment 1 described above, same reference characters are used, and redundant descriptions are omitted.

That is, as shown in FIG. 10, in the switching circuit 18 of this embodiment, one thin film transistor, i.e., a thin film transistor Tr2, is used in the second switching unit SW2. The thin film transistor Tr2 is a double gate structure transistor, and includes a gate electrode g3 and a bottom gate electrode 22.

As shown in FIG. 11, FIG. 12(a), FIG. 12(b), and FIG. 12(c), in the switching circuit 18 of this embodiment, the bottom gate electrode 22 is essentially one electrode unitarily formed for the three gate electrodes g1 to g3, and, like in Embodiment 2, it functions as the (lower) light-shielding film blocking the illumination light from the backlight device 3. That is, as shown in FIG. 12(b), the bottom gate electrode 22 is formed under the silicon layer SL, between an edge of the source region 25 and an edge of the drain region 41, blocking the light projected from the bottom of the FIG. 12(b), which is the illumination light from the backlight device 3, for example, from entering the low concentration impurity regions 26, 28, 30, 32, 34, and 36 and the channel regions 27, 31, and 35.

In the switching circuit 18 according to this embodiment, a high concentration region 50 is disposed between the low concentration impurity region 36 and the drain region 41.

With the configuration described above, this embodiment can provide the functions and effects similar to those of Embodiment 2.

Embodiment 4

Figure 13:
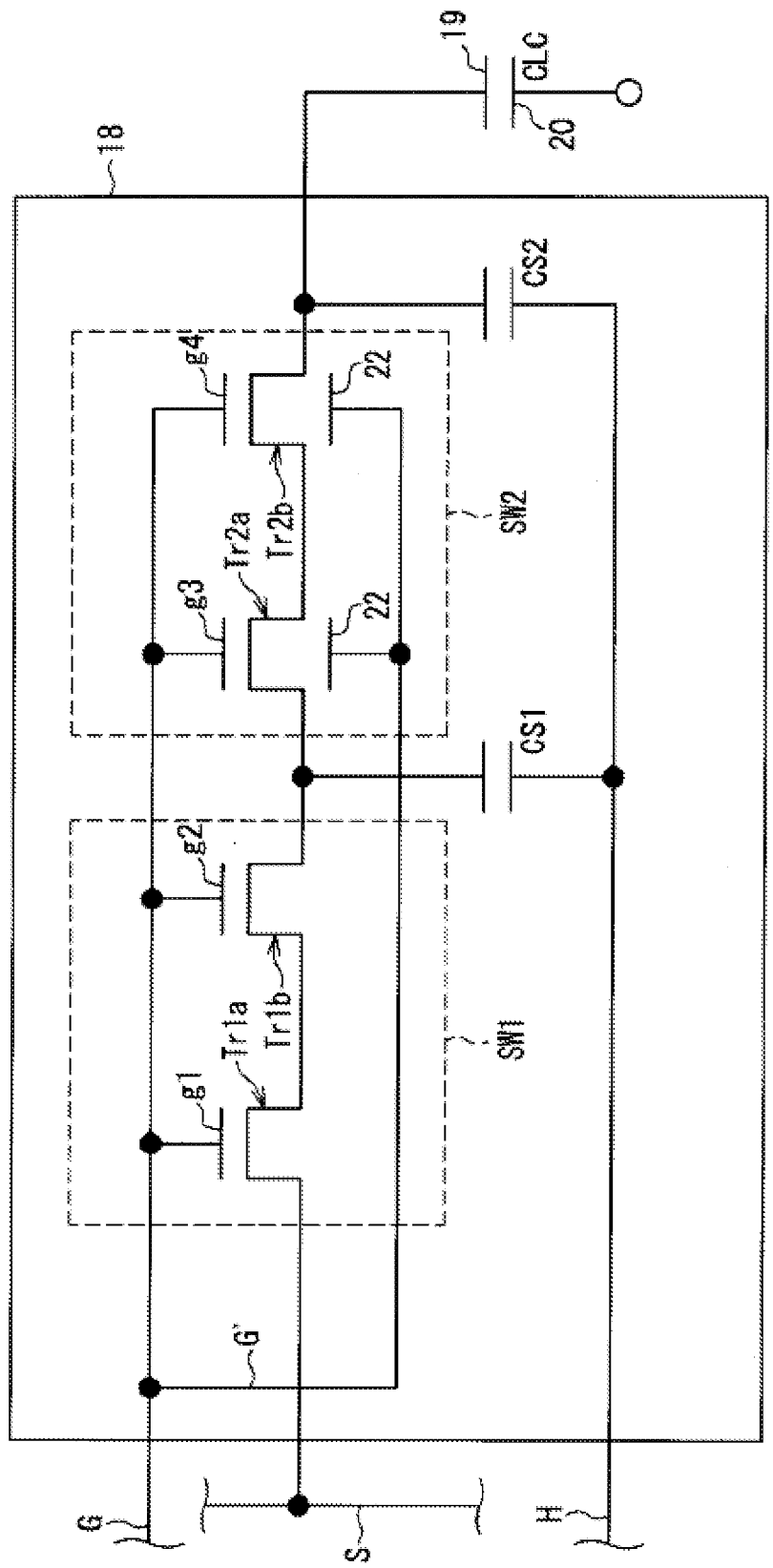
FIG. 13 is a circuit diagram showing an equivalent circuit of a switching circuit according to Embodiment 4 of the present invention.
Figure 14:
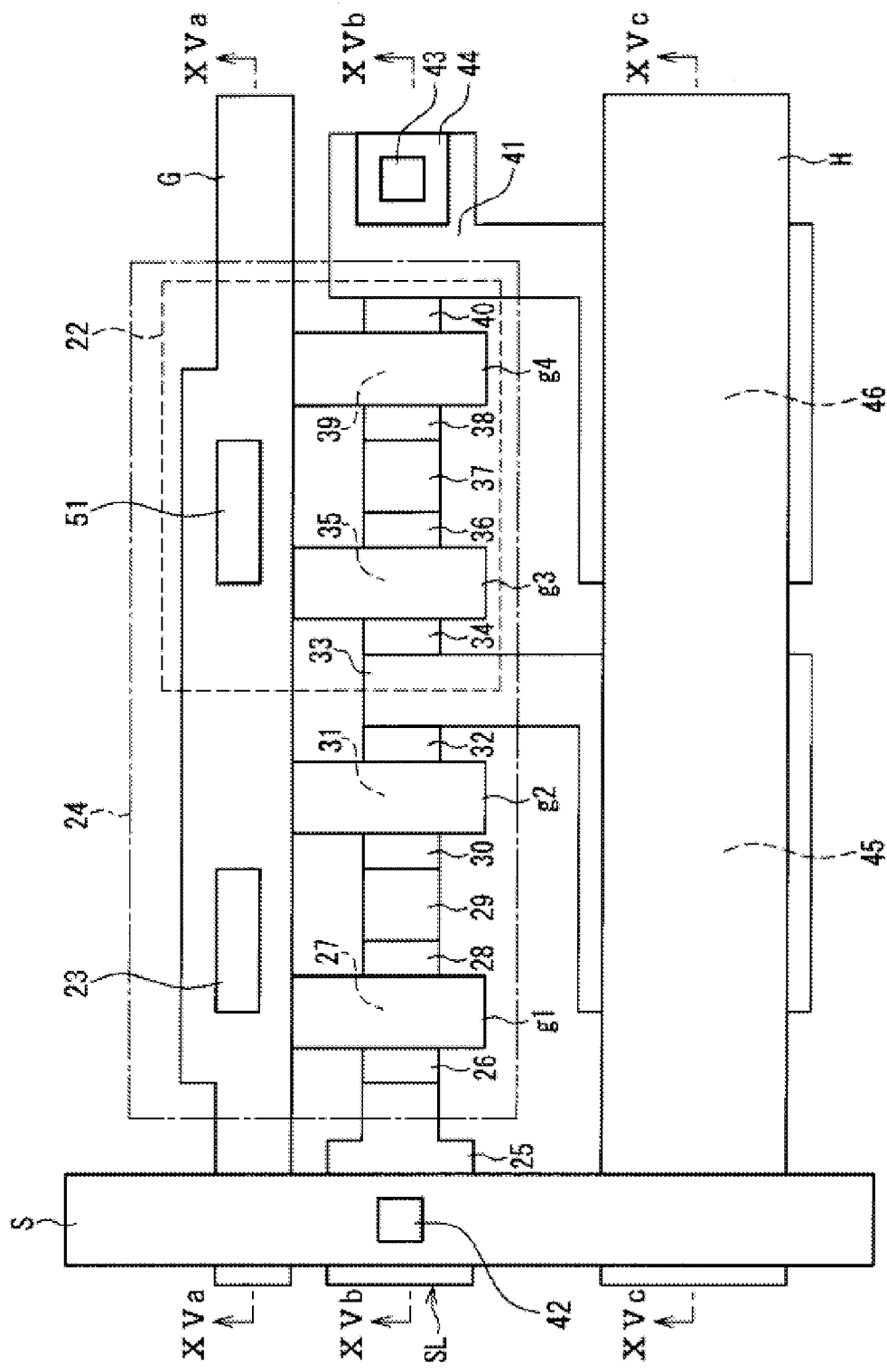
FIG. 14 is a plan view showing the configuration of the main part of the switching circuit shown in FIG. 13.
Figure 15:
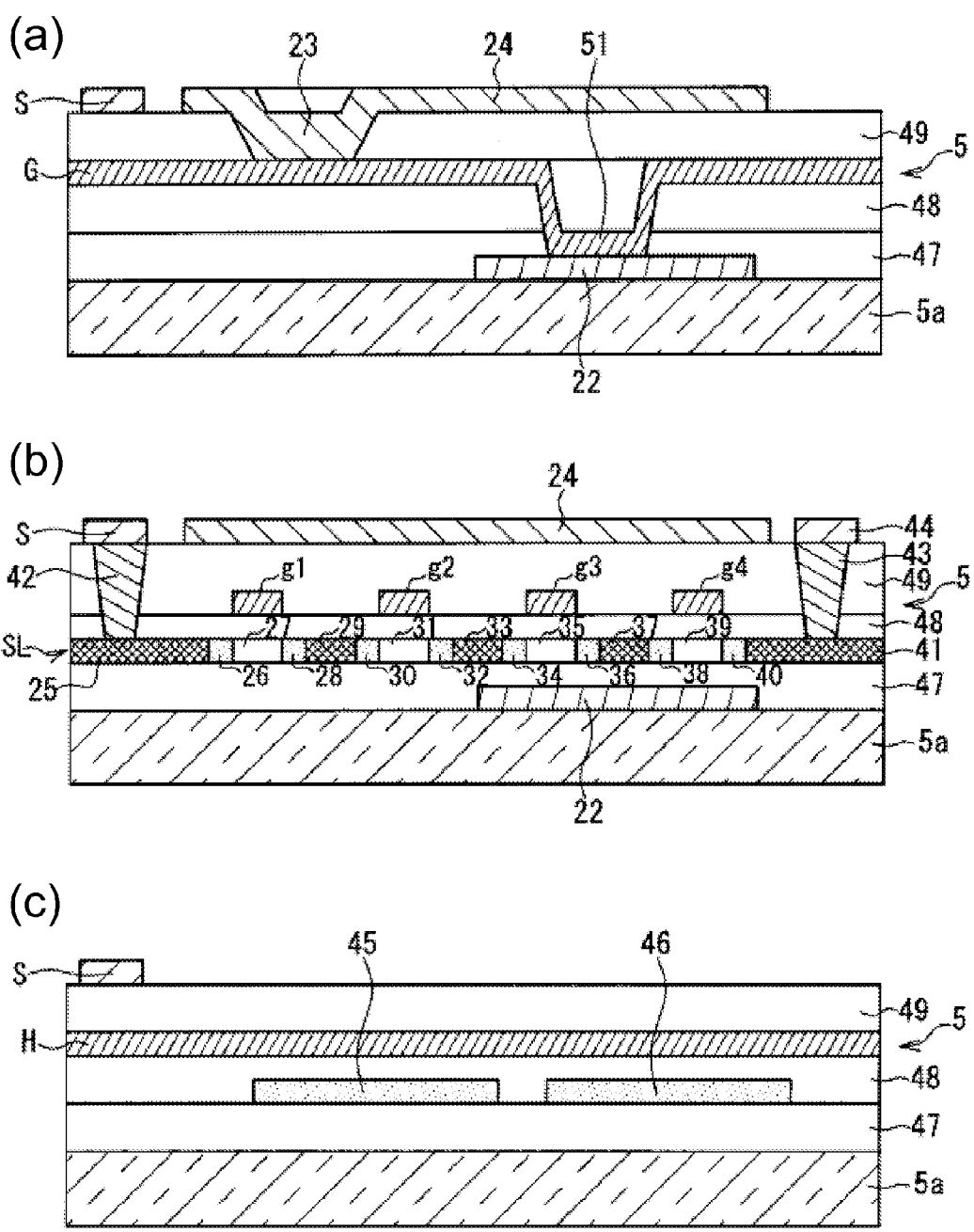
FIG. 15(a), FIG. 15(b), and FIG. 15(c) are cross-sectional views taken along the line XVa-XVa, line XVb-XVb, and line XVc-XVc, respectively, of FIG. 14.

FIG. 13 is a circuit diagram showing an equivalent circuit of a switching circuit according to Embodiment 4 of the present invention. FIG. 14 is the configuration of the main part of the switching circuit shown in FIG. 13. FIG. 15(a), FIG. 15(b), and FIG. 15(c) are cross-sectional views taken along the line XVa-XVa, line XVb-XVb, and line XVc-XVc, respectively, of FIG. 14. As shown in the figures, the main difference between this embodiment and Embodiment 1 is that, in this embodiment, the (top) gate electrode and the bottom gate electrode are electrically connected to each other. For elements common to Embodiment 1 described above, same reference characters are used and redundant descriptions are omitted.

That is, as shown in FIG. 13, in the switching circuit 18 according to this embodiment, the gate electrode wiring G and the bottom gate electrode wiring G' are electrically connected to each other. Thus, in the switching circuit 18 of this embodiment, the gate electrodes (top gate electrodes) g1 to g4 and the bottom gate electrode 22 are electrically connected to each other. As a result, the same gate signal is supplied to the gate electrodes g1 to g4 and to the bottom gate electrode 22.

As shown in FIG. 14, FIG. 15(a), FIG. 15(b), and FIG. 15(c), in the switching circuit 18 of this embodiment, the gate electrode wiring G is electrically connected to the bottom gate electrode 22 (bottom gate electrode wiring G') through a contact 51.

With the configuration described above, this embodiment can provide the functions and effects similar to those of Embodiment 1. Also in this embodiment, the gate electrodes g1 to g4 and the bottom gate electrode 22 are electrically connected to each other. Therefore, by controlling the potentials at gate electrodes g1 to g4, the potential at the bottom gate electrode 22 can appropriately be controlled. As a result, according to this embodiment, fluctuation of the potential at the bottom gate electrode 22 due to the capacitive coupling of the bottom gate electrode 22 and the silicon layer (semiconductor layer) SL can be prevented, and consequently the leakage current can also be prevented.

Embodiment 5

Figure 16:
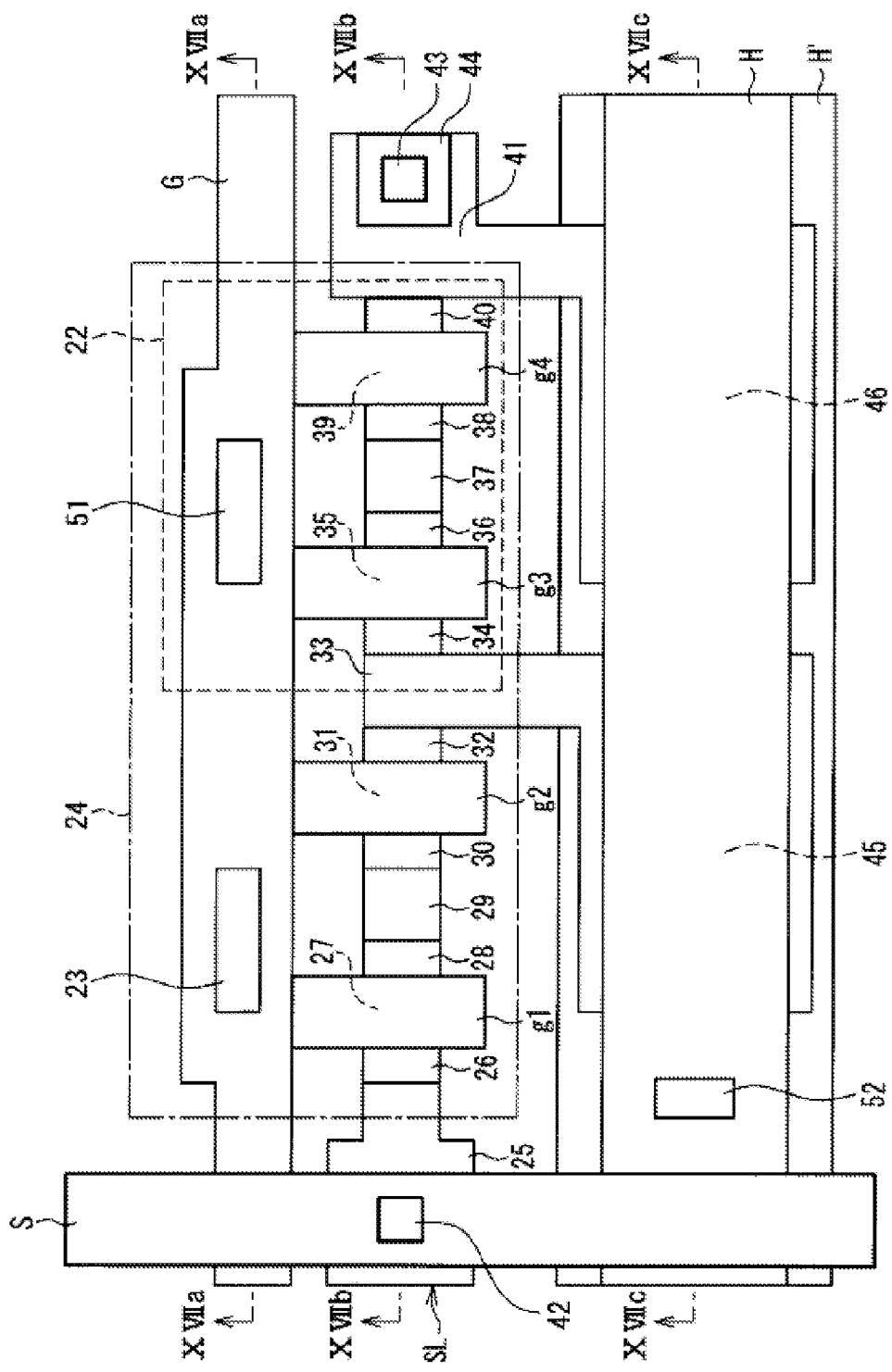
FIG. 16 is a plan view showing the configuration of the main part of a switching circuit according to Embodiment 5 of the present invention.
Figure 17:
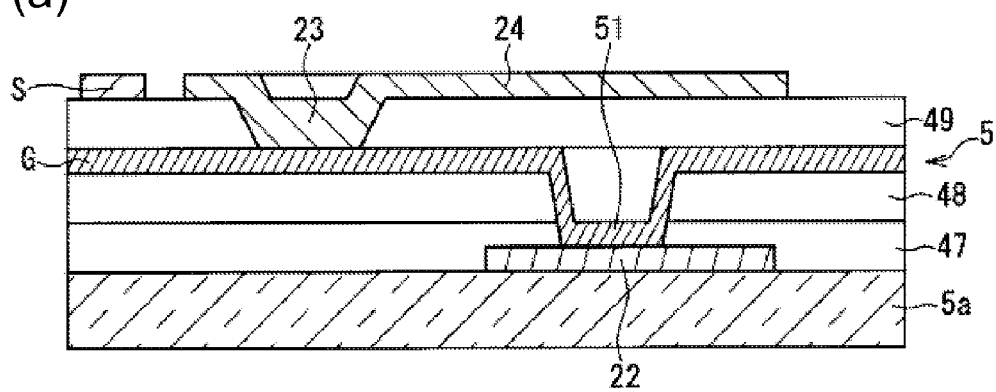
FIG. 17(a), FIG. 17(b), and FIG. 17(c) are cross-sectional views taken along the line XVIIa-XVIIa, line XVIIb-XVIIb, and line XVIIc-XVIIc, respectively, of FIG. 16.
Figure 17:
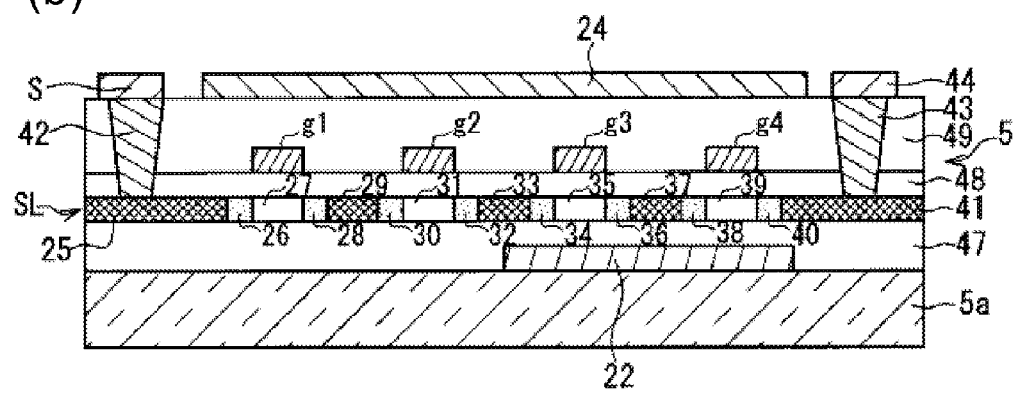
Figure 17:
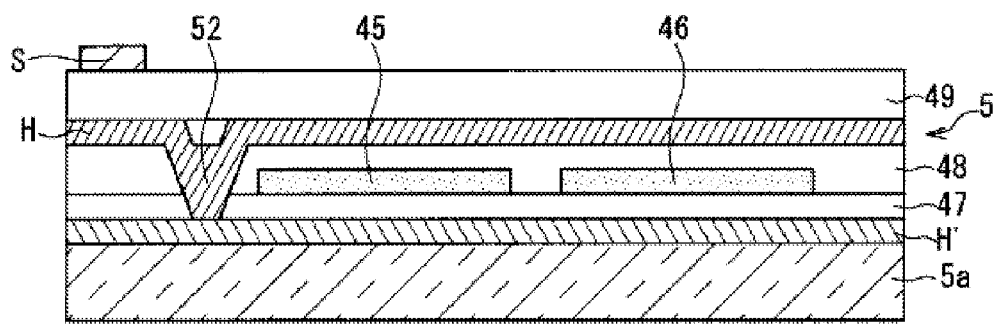

FIG. 16 is a plan view showing the configuration of the main part of the switching circuit according to Embodiment 5 of the present invention. FIG. 17(a), FIG. 17(b), and FIG. 17(c) are cross-sectional views taken along the line XVIIa-XVIIa, line XVIIb-XVIIb, and line XVIIc-XVIIc, respectively, of FIG. 16. As shown in the figures, the main difference between this embodiment and Embodiment 4 described above is that, in this embodiment, two storage capacitance common electrode wirings, which are disposed in parallel to each other and electrically connected to each other, are employed. For elements common to Embodiment 4, same reference characters are used and redundant descriptions are omitted.

That is, as shown in FIG. 16, FIG. 17(a), FIG. 17(b), and FIG. 17(c), the switching circuit 18 of this embodiment has two storage capacitance common electrode wirings H and H'. The storage capacitance common electrode wirings H and H' are disposed such that they overlap with one another via low concentration regions 45 and 46 in the direction normal to the surface of FIG. 16. The storage capacitance common electrode wirings H and H' are electrically connected to each other through a contact 52. Thus, in the switching circuit 18 of this embodiment, the first storage capacitance CS1 is composed of a low concentration region 45, a portion of the gate insulating film 48 and a portion of the storage capacitance common electrode wiring H located over the low concentration region 45, and a portion of the base insulating film 47 and a portion of the storage capacitance common electrode wiring H' located under the low concentration region 45. The second storage capacitance CS2 is composed of a low concentration region 46, a portion of the gate insulating film 48 and a portion of the storage capacitance common electrode wiring H located over the low concentration region 46, and a portion of the base insulating film 47 and a portion of the storage capacitance common electrode wiring H' under the low concentration region 46.

With the configuration described above, this embodiment can provide the functions and effects similar to those of Embodiment 4. Also in this embodiment, because two storage capacitance common electrode wirings H and H' are provided, capacitance values of the first and the second storage capacitances can easily be increased.

Embodiment 6

Figure 18:
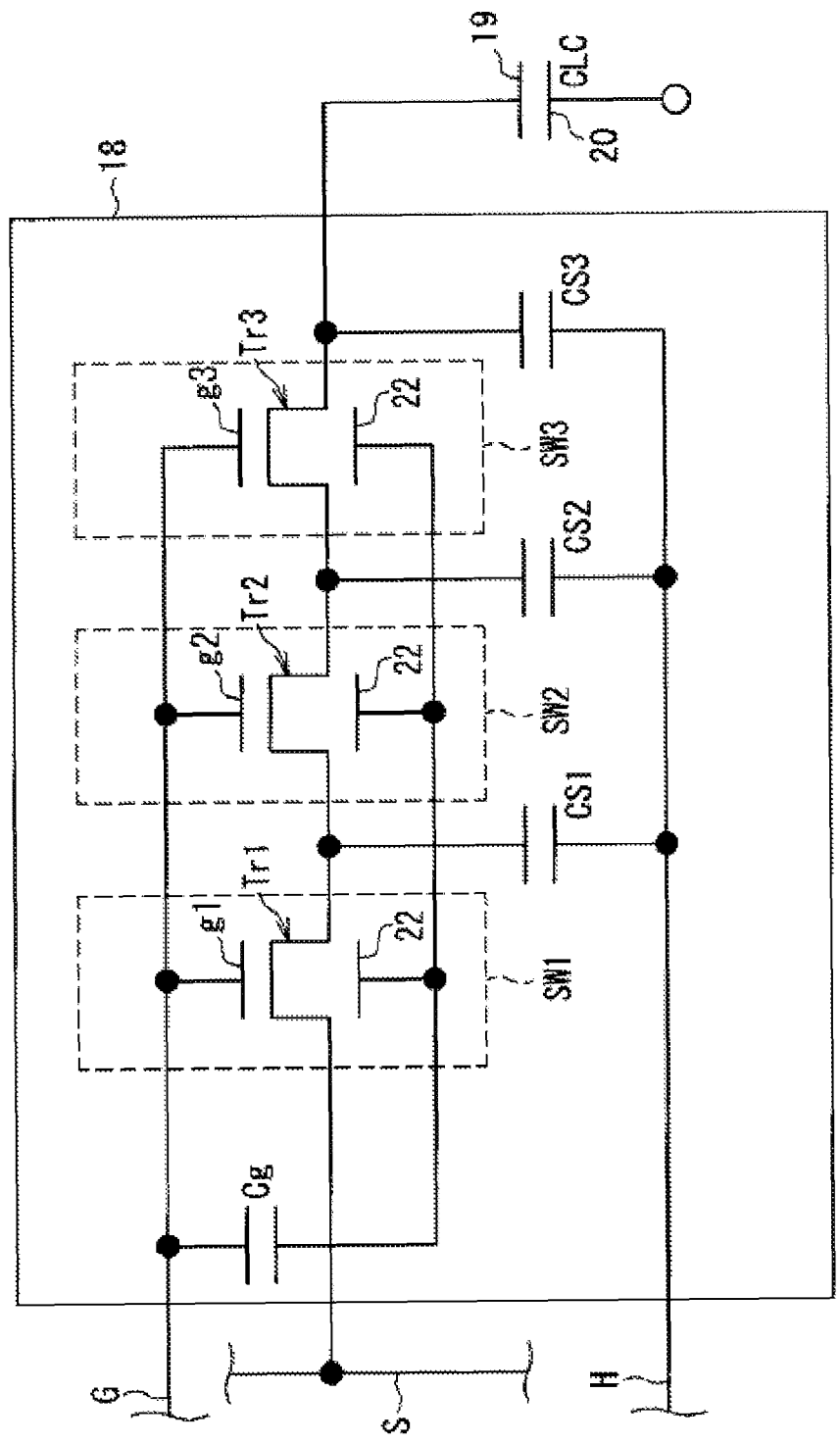
FIG. 18 is a circuit diagram showing an equivalent circuit of a switching circuit according to Embodiment 6 of the present invention.
Figure 19:
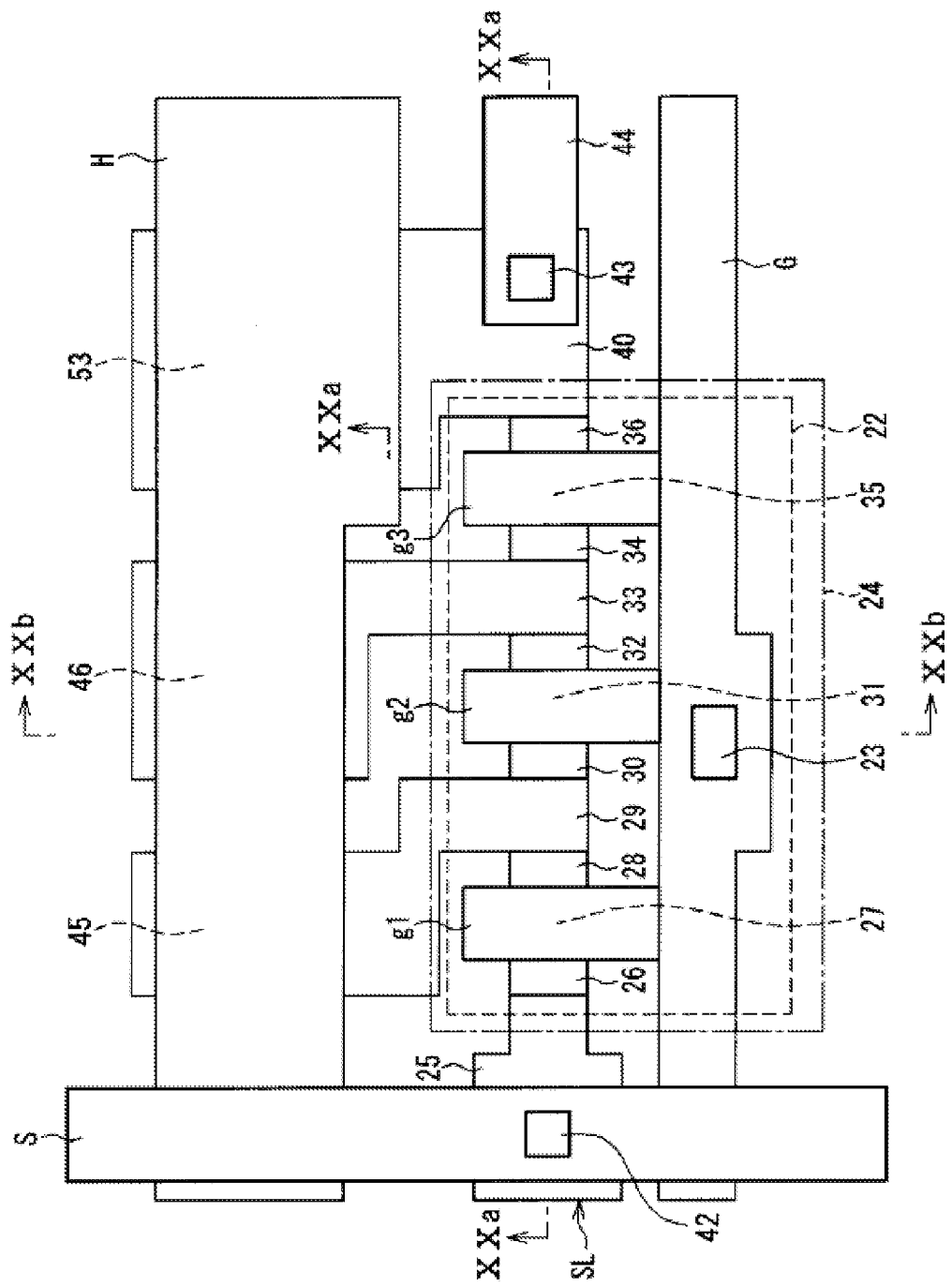
FIG. 19 is a plan view showing the configuration of the main part of the switching circuit shown in FIG. 18.
Figure 20:
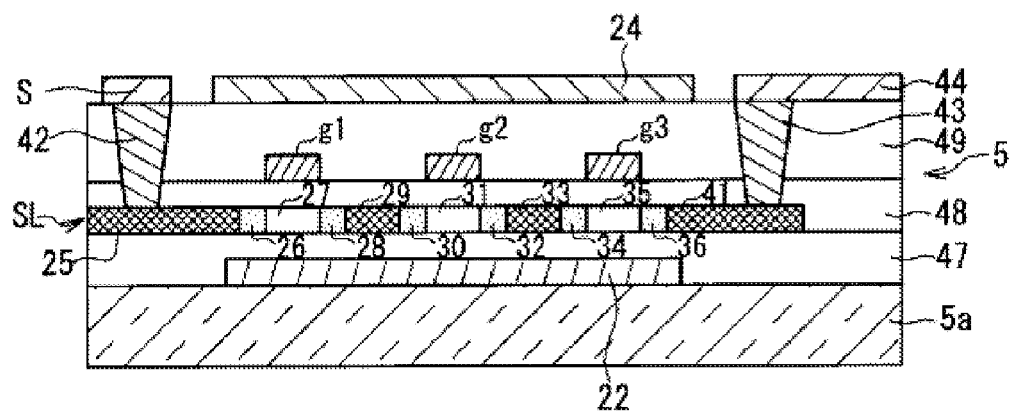
FIG. 20(a) and FIG. 20(b) are cross-sectional views taken along the line XXa-XXa and the line XXb-XXb, respectively, of FIG. 19.
Figure 20:
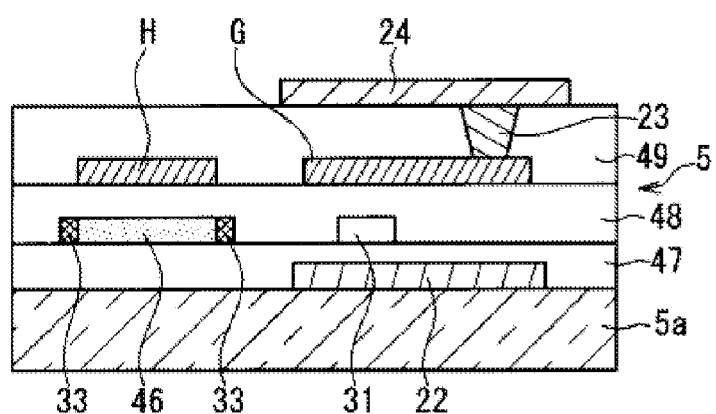

FIG. 18 is a circuit diagram showing an equivalent circuit of a switching circuit according to Embodiment 6 of the present invention. FIG. 19 is a plan view showing the configuration of the main part of the switching circuit shown in FIG. 18. FIG. 20(a) and FIG. 20(b) are cross-sectional views taken along the line XXa-XXa and line XXb-XXb, respectively, of FIG. 19. As shown in the figures, the main difference between this embodiment and Embodiment 1 described above is that, in this embodiment, three switching units are connected in series to one another, and the first to the third storage capacitances are provided. Another main difference is that, in this embodiment, the (top) gate electrode and the bottom gate electrode are capacitively coupled. For elements common to Embodiment 1, same reference characters are used and redundant descriptions are omitted.

That is, as shown in FIG. 18, in the switching circuit 18 according to this embodiment, the first, the second, and the third switching units SW1, SW2, and SW3 are connected in series sequentially. For the first, the second, and the third switching units SW1, SW2, and SW3, thin film transistors Tr1, Tr2, and Tr3, each composed of a double gate structure transistor, are used, respectively.

Also in the switching circuit 18 according to this embodiment, as shown in FIG. 19 and FIG. 20(a), the bottom gate electrode 22 is essentially one electrode unitarily configured for three gate electrodes g1 to g3, and, like in Embodiment 1, it also functions as the (lower) light-shielding film blocking the illumination light from the backlight device 3. That is, as shown in FIG. 20(a), the bottom gate electrode 22 is formed below the silicon layer SL between an edge of the source region 25 and an edge of the drain region 41, and prevents the light from the bottom side of FIG. 20(a), i.e., the illumination light from the backlight device 3, for example, from entering the low concentration impurity regions 26, 28, 30, 32, 34, and 36 and the channel regions 27, 31, and 35.

In the switching circuit 18 of this embodiment, as shown in FIG. 18, the first, the second, and the third storage capacitances CS1, CS2, and CS3 are connected in parallel with each other. That is, one electrode of the first storage capacitance (the first capacitance) CS1 is connected to the connecting section of the first and the second switching units SW1 and SW2. One electrode of the second storage capacitance (second capacitance) CS2 is connected to the connecting section of the second and the third switching units SW2 and SW3. Also, one electrode of the third storage capacitance (the third capacitance) CS3 is connected to the end of the third switching unit SW3 on the side opposite from the connecting section with the second switching unit SW2. The other electrodes of the first, the second, and the third storage capacitances CS1, CS2, and CS3 are connected to the storage capacitance common electrode wiring H. Also in this embodiment, the liquid crystal capacitance CLC constitutes an external capacitance connected parallel to the third storage capacitance CS3 for the third switching unit SW3.

The first storage capacitance CS1 is, similar to that in Embodiment 1, composed of the low concentration region 45, and a portion of the gate insulating film 48 and a portion of the storage capacitance common electrode wiring H located over the low concentration region 45. The second storage capacitance CS2 is, similar to that of Embodiment 1, composed of the low concentration region 46, and a portion of the gate insulating film 48 and a portion of the storage capacitance common electrode wiring H located over the low concentration region 46. The third storage capacitance CS3 is composed of the low concentration region 53, a portion of the gate insulating film 48 and a portion of the storage capacitance common electrode wiring H located over the low concentration region 53.

Further, in the switching circuit 18 of this embodiment, the capacitance ratios of the first, the second, and the third storage capacitances CS1, CS2, and CS3 are set to the optimum value determined in consideration of the size of the liquid crystal capacitance CLC as described in detail below. Thus, the voltage fluctuation at the above-mentioned one end of the switching circuit 18, i.e., the pixel voltage fluctuation at the liquid crystal capacitance CLC, can be reliably suppressed.

In the switching circuit 18 of this embodiment, as indicated by capacitance Cg in FIG. 18, the gate electrodes (top gate electrodes) g1 to g3 and the bottom gate electrode 22 are capacitively coupled with each other. That is, as shown in FIG. 20(b), the gate electrode wiring G and the bottom gate electrode 22 are disposed to overlap one another through the gate insulating film 48 and the base insulating film 47, and the gate electrodes g1 to g3 and the bottom gate electrode 22 are configured to be capacitively coupled.

Figure 21:
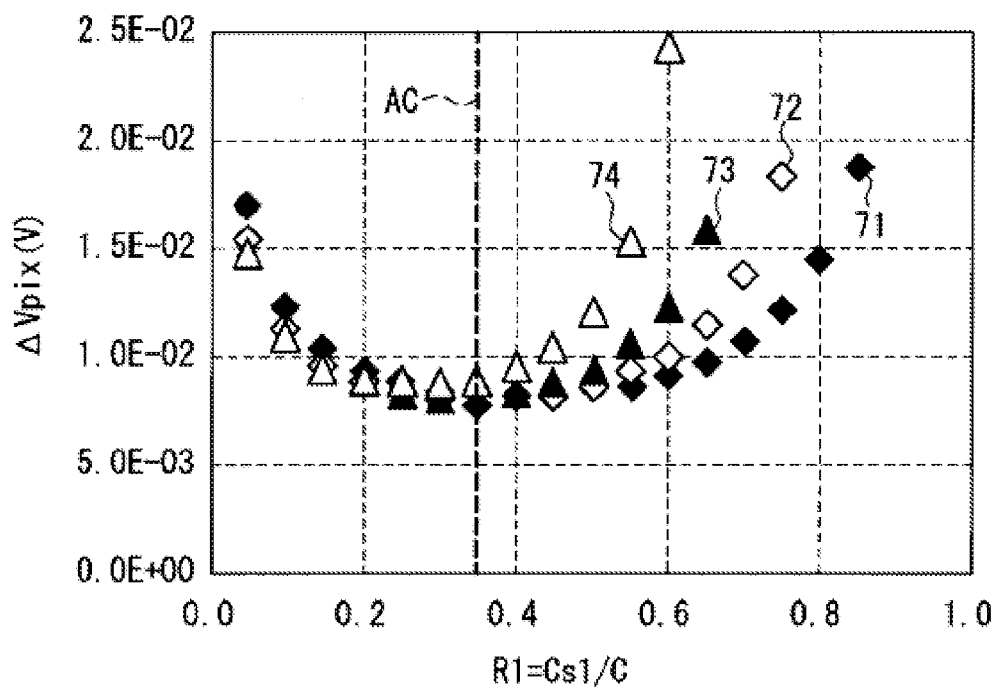
FIG. 21 is a graph showing a relationship between the optimum capacitance ratio and the pixel voltage fluctuation in the switching circuit shown in FIG. 18.

Next, with reference to FIG. 21, the reduction in the pixel voltage fluctuation as an effect of the optimization of the capacitance ratio of the first storage capacitance CS1, the second storage capacitance CS2, and the third storage capacitance CS3 in the switching circuit 18 is described in detail.

FIG. 21 is a graph showing the relationship between the optimum capacitance ratio and the pixel voltage fluctuation in the switching circuit shown in FIG. 18.

In the switching circuit 18 according to this embodiment, capacitance ratios of R1, R2, and R3 of the respective first, second, and third storage capacitances CS1, CS2, and CS3 are set to satisfy Equation (4), Equation (5), and Equation (6) below. This way, in the switching circuit 18 of this embodiment, capacitance ratios R1, R2, and R3 of the first, second, and third storage capacitances CS1, CS2, and CS3 are optimized to reliably suppress the pixel voltage fluctuation.

More specifically, the inventor of the present invention found that when the voltages Vds between one end and the other end of the second switching unit SW2 and of the third switching unit SW3 are at least 0(V) and no more than 1(V), the leakage current Ioff of the second switching unit SW2 and that of the third switching unit SW3 are obtained from Equation (1) below. Further, the inventor of the present invention found that, based on an approximate equation of Equation (1), the capacitance values Cs1, Cs2, and Cs3 of the first, second and third storage capacitances CS1, CS2, and CS3 that minimize the (voltage) fluctuation ΔVpix of the pixel voltage Vpix which fluctuation is caused by the leakage current can be expressed by Equation (C), Equation (D), and Equation (E) below. Further, the inventor of the present invention found that, based on Equation (C), Equation (D), and Equation (E), and plots 71, 72, 73, and 74 of FIG. 21, the optimum capacitance ratios R1, R2, and R3 of the first, the second and the third storage capacitances CS1, CS2, and CS3 can be expressed respectively by Equation (4), Equation (5), and Equation (6) below.

$$Ioff = Io \times Vdsn \quad (1)$$

$$Cs1 = \{n \times n/(n \times n + n + 1)\} \times (C + Cv) \quad (C)$$

$$Cs2 = \{n/(n \times n + n + 1)\} \times (C + Cv) \quad (D)$$

$$Cs3 = \{1/(n \times n + n + 1)\} \times (C - n \times n \times Cv - n \times Cv) \quad (E)$$

$$R1 = \{n \times n/(n \times n + n + 1)\} \times \{(C + Cv)/C\} \pm 0.15 \quad (4)$$

$$R2 = \{n/(n \times n + n + 1)\} \times \{(C + Cv)/C\} \pm 0.15 \quad (5)$$

$$R3 = \{1/(n \times n + n + 1)\} \times \{(C - n \times n \times Cv - n \times Cv)/C\} \pm 0.10 \quad (6)$$

where, Io is the leakage current when Vds=1(V); n=0.7 to 0.8; Cs1:Cs2:Cs3=R1:R2:R3; R1+R2+R3=1; Cs1+Cs2+Cs3=C; and Cv is the capacitance value of the external capacitance connected in parallel to the third storage capacitance CS3 for the third switching unit SW3, i.e., the capacitance value of the liquid crystal capacitance CLC.

When n=0.73, C=200(fF), and Cv=100(fF) in Equation (C), Equation (D), and Equation (E), values subjected to ±0.15 in Equation (4) and Equation (5), and the value subjected to ±0.10 in Equation (6) are R1=0.35, R2=0.48, and R3=0.16, respectively, which are optimum values. Further, the fluctuation ΔVpix when R3 is fixed to a particular value and the ratio R1:R2 is changed is obtained by calculation. Specifically, the relationships between R1 and the fluctuation ΔVpix when R3 is fixed to 0.05, 0.16, 0.25, and 0.35 are indicated as plots 71, 72, 73, and 74, respectively, in FIG. 21. Then, from plots 72 and the optimum condition AC (=0.35), a range in which the increase of the fluctuation ΔVpix is smallest is determined to be ±0.15 in Equation (4) and Equation (5). Because the optimum value of R3 is 0.16, which is small, the tolerance of R3 is set to ±0.10.

Also in the switching circuit 18 of this embodiment, leakage current at the first, second and third switching units SW1, SW2, and SW3 is significantly reduced, and the fluctuation ΔVpix of the pixel voltage Vpix becomes small as indicated by plots 72. Therefore, in the switching circuit 18 of this embodiment, the frame frequency adjustment unit 15c can, like in Embodiment 1, adjust the frame frequency to a prescribed frequency (10 Hz, for example) or lower in accordance with the image signal inputted.

Specifically, according to the calculation by the inventor of the present invention, in the switching circuit 18 of this embodiment, when n=0.73, C=200(fF), Cv=100(fF), the time during which the fluctuation ΔVpix is 10 mV (i.e., the time during which the voltage is maintained at the liquid crystal capacitance CLC) is 1017 ms. Therefore, in the switching circuit 18 of this embodiment, the lowest frame frequency may be set to 1.0 Hz. However, this frame frequency is the result of the calculation based on the leakage current when the ambient temperature of the liquid crystal panel 2 (switching circuit 18) is 40° C. Therefore, in the actual switching circuit 18, the frame frequency adjustment unit 15c, like in Embodiment 1, needs to set the minimum frame frequency in consideration of the increase in leakage current due to the rise in the ambient temperature and stray light.

With the configuration described above, this embodiment can provide the functions and effects similar to those of Embodiment 1. Also in this embodiment, because the gate electrodes g1 to g3 and the bottom gate electrode 22 are capacitively coupled with each other, by controlling the potentials at the gate electrodes g1 to g3, the potential at the bottom gate electrode 22 can appropriately be controlled. As a result, according to this embodiment, fluctuation of the potential at the bottom gate electrode 22 due to the capacitive coupling of the bottom gate electrode 22 and the silicon layer (semiconductor layer) SL can be prevented, and consequently, the leakage current can also be prevented.

Modification Example of Embodiment 6

Figure 22:
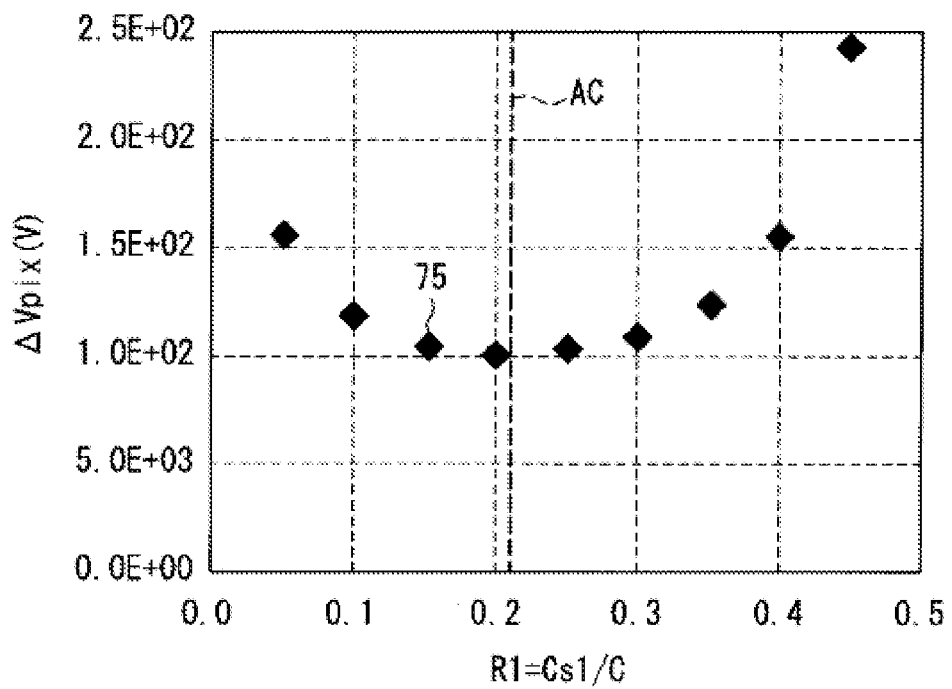
FIG. 22 is a graph showing another relationship between the optimum capacitance ratio and the pixel voltage fluctuation in the switching circuit shown in FIG. 18.

FIG. 22 is a graph showing another relationship between the optimum capacitance ratio and the pixel voltage fluctuation at the switching circuit shown in FIG. 18. As shown in the figure, the main difference between this embodiment and Embodiment 6 described above is that, in this embodiment, the capacitance ratios of the first and second storage capacitances are determined using a fixed capacitance value of the third storage capacitance. For elements common to Embodiment 6, same reference characters are used and redundant descriptions are omitted.

That is, when employing the switching circuit 18 of Embodiment 6 for the liquid crystal display device 1, from the perspective of reducing the field through voltage at the liquid crystal display device 1, the capacitance value Cs3 of the third storage capacitance CS3 is preferably set to a value higher than the prescribed value. In other words, in the switching circuit 18 of Embodiment 6, when the capacitance ratios R1, R2, and R3 for the first, the second, and the third storage capacitances CS1, CS2, and CS3 are optimized, the areas of the first, second, and third storage capacitances CS1, CS2, CS3 can become so large that the actual formation of the first, second, and third storage capacitances CS1, CS2, and CS3 can be difficult. Therefore, the inventor of the present invention devised a way to reduce the fluctuation ΔVpix of the pixel voltage Vpix, i.e., by optimizing the capacitance ratios R1 and R2 of the first and second storage capacitances CS1 and CS2 with the capacitance value Cs3 of the third storage capacitance CS3 fixed to a prescribed value.

That is, in the switching circuit 18, capacitance ratios R1 and R2 of the first and second storage capacitances CS1 and CS2 are set to satisfy Equation (7) and Equation (8) below. Thus, in the switching circuit 18 of this embodiment, the capacitance ratios R1 and R2 of the first and second storage capacitances CS1 and CS2 are optimized, and therefore, the pixel voltage fluctuation can reliably be suppressed.

Specifically, the inventor of the present invention found that when the voltages Vds between one end and the other end of the second and of the third switching units SW2 and SW3 are both between 0V and 1V, the leakage current Ioff of the second and third switching units SW2 and SW3 can be obtained from Equation (1) below. Further, the inventor of the present invention found that, based on an approximate equation of Equation (1), capacitance values Cs1, Cs2, and Cs3 of the first, second, and third storage capacitances CS1, CS2, and CS3 that minimize the (voltage) fluctuation ΔVpix of the pixel voltage Vpix, which fluctuation is caused by the leakage current, can respectively be expressed by Equation (F), Equation (G), and Equation (H) below. Further, the inventor of the present invention found that, based on Equation (F), Equation (G), and Equation (H) and plots 75 in FIG. 22, the optimum capacitance ratios R1 and R2 of the first and second storage capacitances CS1 and CS2 can respectively be expressed in Equation (7) and Equation (8) below.

$$Ioff = Io \times Vds^n \quad (1)$$

$$Cs1 = n/(n+1) \times (C - Cs3) \quad (F)$$

$$Cs2 = 1/(n+1) \times (C - Cs3) \quad (G)$$

$$C = Cs1 + Cs2 + Cs3 \quad (H)$$

$$R1 = \{n/(n+1)\} \times \{(C - Cs3)/C\} \pm 0.1 \quad (7)$$

$$R2 = \{1/(n+1)\} \times \{(C - Cs3)/C\} \pm 0.1 \quad (8)$$

where Io is the leakage current when Vds=1(V); n=0.7 to 0.8; and Cs1:Cs2=R1:R2.

When n=0.73, C=200(fF), Cs3=100(fF), and Cv=100(fF) in Equation (C), Equation (D), and Equation (E), values subjected to ±0.1 in Equation (7) and Equation (8) above are R1=0.21 and R2=0.29, respectively, which are the optimum values. Also, because R1+R2+R3=1 is satisfied, the capacitance ratio R3 of the third storage capacitance CS3 when the capacitance value Cs3 is fixed is 0.50. Further, from plots 75 showing the relationship between R1 and the fluctuation ΔVpix, and the optimum condition AC (=0.21), a range in which the increase in the fluctuation ΔVpix is smallest, is determined to be ±0.1 in Equation (7) and Equation (8).

Also in the switching circuit 18 of this embodiment, leakage current at the first, second, and third switching units SW1, SW2, and SW3 is significantly reduced, and the fluctuation ΔVpix of the pixel voltage Vpix becomes small as indicated by plots 75. Therefore, in the switching circuit 18 of this embodiment, the frame frequency adjustment unit 15c can, like in Embodiment 1, adjust the frame frequency to a prescribed frequency (10 Hz, for example) or lower in accordance with the image signal inputted.

Specifically, according to the calculation by the inventor of the present invention, in the switching circuit 18 of this embodiment, when n=0.73, C=200(fF), Cs3=100(fF), and Cv=100(fF), the time during which the fluctuation ΔVpix is 10 mV (i.e., the time during which the voltage is maintained at the liquid crystal capacitance CLC) is 458 ms. Therefore, in the switching circuit 18 of this embodiment, the lowest frame frequency may be set to 2.2 Hz. However, this frame frequency is the result of the calculation based on the leakage current when the ambient temperature of the liquid crystal panel 2 (switching circuit 18) is 40° C. Therefore, in the actual switching circuit 18, the frame frequency adjustment unit 15c, like in Embodiment 1, needs to set the minimum frame frequency in consideration of the increase in leakage current due to the rise in the ambient temperature and stray light.

With the configuration described above, this embodiment can provide the functions and effects similar to those of Embodiment 6. Also in this embodiment, because the optimum capacitance ratios R1 and R2 of the first and second storage capacitances CS1 and CS2 are obtained with the capacitance value Cs3 of the third storage capacitance CS3 fixed to a prescribed value, the field-through voltage of the liquid crystal display device 1 can easily be reduced, and the first, second, and third storage capacitances CS1, CS2, and CS3 can appropriately be formed.

Embodiment 7

Figure 23:
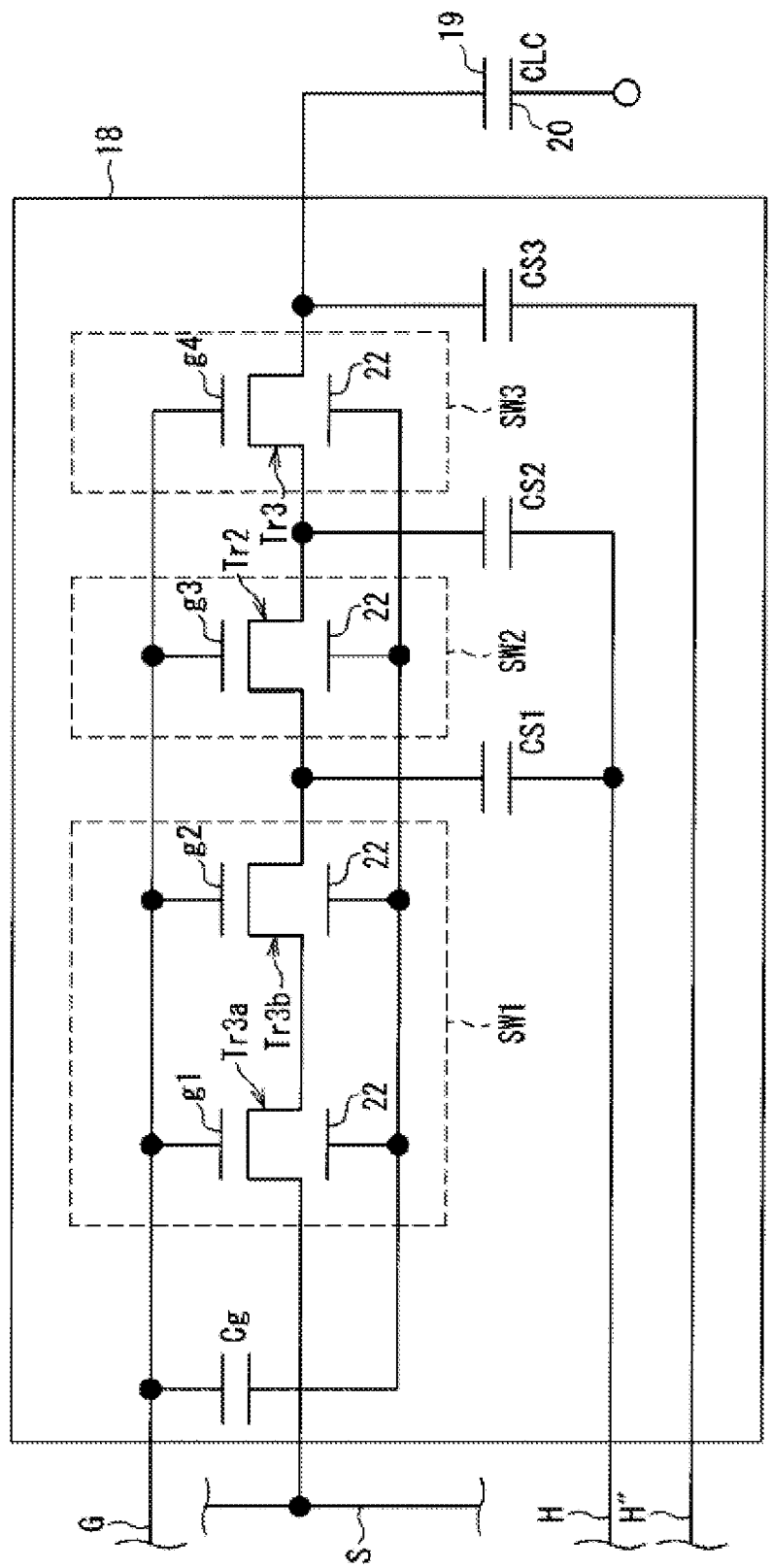
FIG. 23 is a circuit diagram showing an equivalent circuit of a switching circuit according to Embodiment 7 of the present invention.
Figure 24:
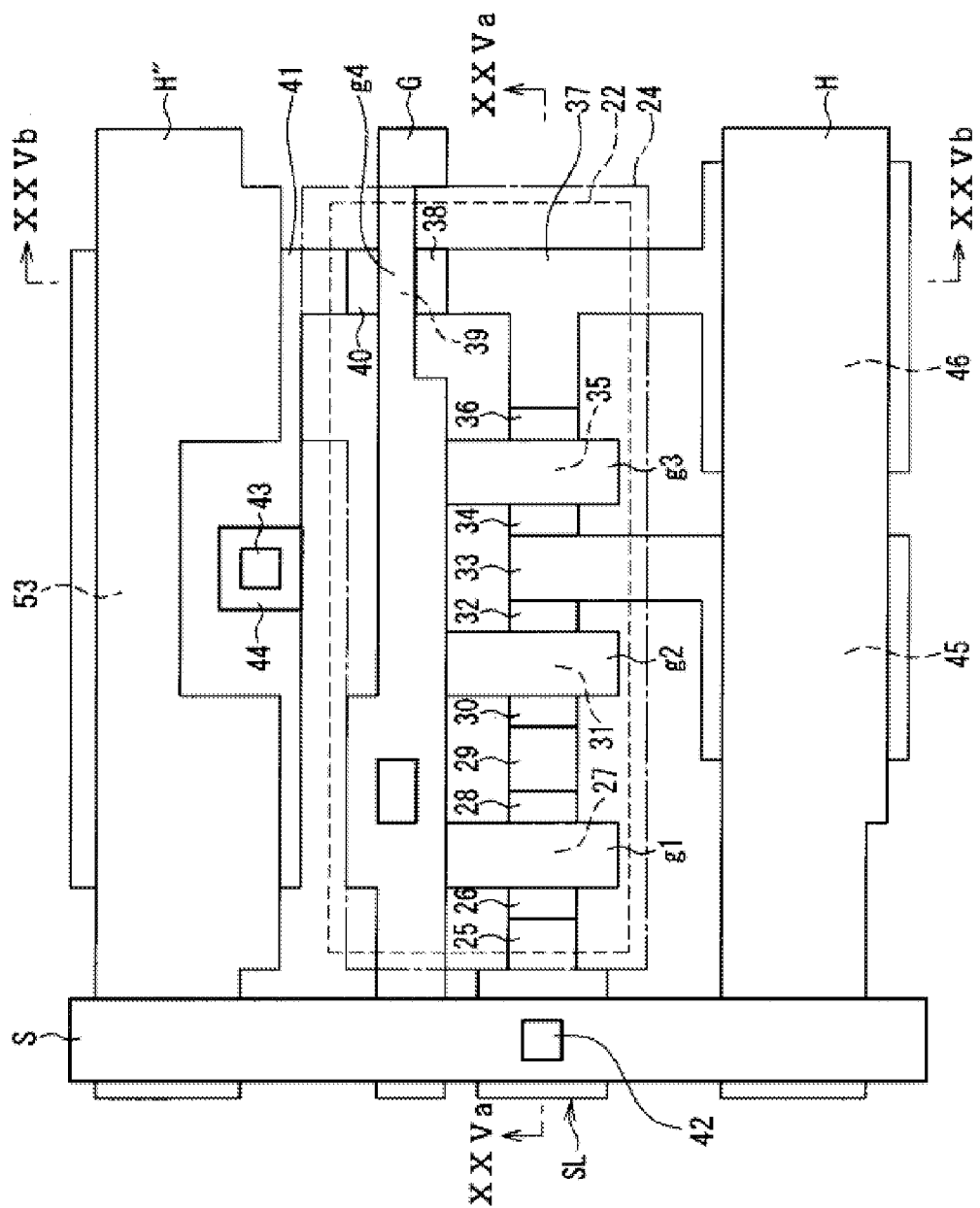
FIG. 24 is a plan view showing the configuration of the main part of the switching circuit shown in FIG. 23.
Figure 25:
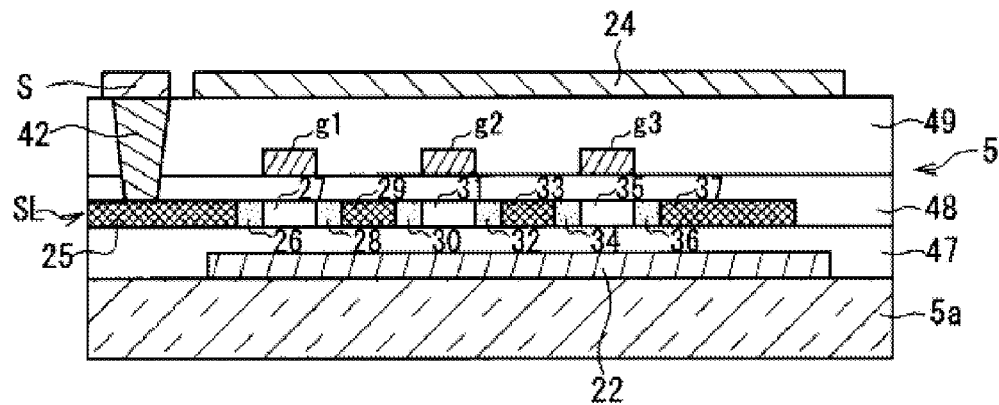
FIG. 25(a) and FIG. 25(b) are cross-sectional views taken along the line XXVa-XXVa and line XXVb-XXVb, respectively, of FIG. 19.
Figure 25:
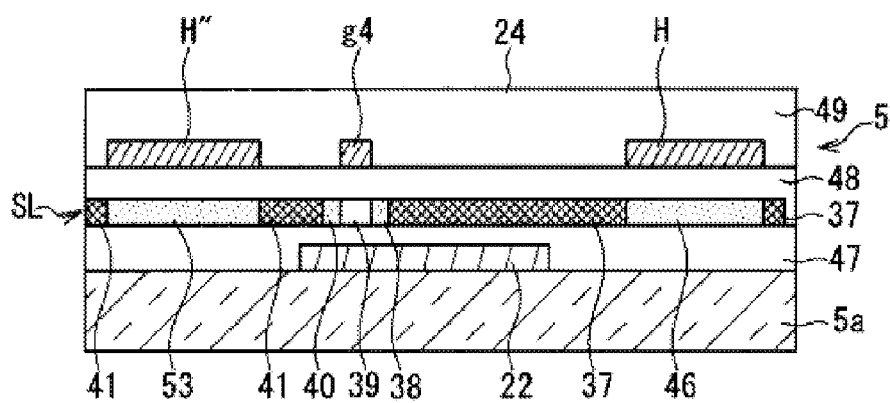

FIG. 23 is a circuit diagram showing an equivalent circuit of a switching circuit according to Embodiment 7 of the present invention. FIG. 24 is a plan view showing the configuration of the main part of the switching circuit shown in FIG. 23. FIG. 25(a) and FIG. 25(b) are cross-sectional views taken along the line XXVa-XXVa and line XXVb-XXVb, respectively, of FIG. 19. As shown in the figures, the main difference between this embodiment and Embodiment 6 is that, in this embodiment, the first to third storage capacitances are split to be disposed on both sides of the first to third switching units, sandwiching the switching units. For elements common to Embodiment 6, same reference characters are used and redundant descriptions are omitted.

That is, as shown in FIG. 23, in the switching circuit 18 of this embodiment, the first and the second storage capacitances CS1 and CS2 are connected parallel to each other, and the third storage capacitance CS3 is provided separately from the first and the second storage capacitances CS1 and CS2. That is, one electrode of the first storage capacitance (the first capacitance) CS1 is connected to the connecting section of the first and the second switching units SW1 and SW2. One electrode of the second storage capacitance (second capacitance) CS2 is connected to the connecting section of the second and the third switching units SW2 and SW3. Also, one electrode of the third storage capacitance (third capacitance) CS3 is connected to the end of the third switching unit SW3 on the side opposite from the connecting section with the second switching unit SW2. The other electrodes of the first and second storage capacitances CS1 and CS2 are connected to the storage capacitance common electrode wiring H, and the other electrode of the third storage capacitance CS3 is connected to the storage capacitance common electrode wiring H", which is configured to be independent of the storage capacitance common electrode wiring H.

Also in the switching circuit 18 of this embodiment, as shown in FIG. 24, FIG. 25(a), and FIG. 25(b), the storage capacitance common electrode wirings H and H" are disposed to sandwich the gate electrode wiring G. Thus, in the switching circuit 18 of this embodiment, the first and the second storage capacitances CS1 and CS2 and the third storage capacitance CS3 are formed to sandwich the first to the third switching units SW1 to SW3.

Also, in the switching circuit 18 of this embodiment, because two storage capacitance common electrode wirings H and H" are used, there is no need to supply signals of the same voltage to the storage capacitance common electrode wirings H and H". As long as the signals have the same phase, they can have different voltages.

With the configuration described above, this embodiment can provide the functions and effects similar to those of Embodiment 6. Also in this embodiment, the first and the second storage capacitances CS1 and CS2 and the third storage capacitance CS3 are formed to sandwich the first to the third switching units SW1 to SW3. Therefore, compared to the case in which the first to the third storage capacitances CS1 to CS3 are formed on one side of the first to the third switching units SW1 to SW3, a more compact switching circuit 18 can easily be configured.

Embodiment 8

Figure 26:
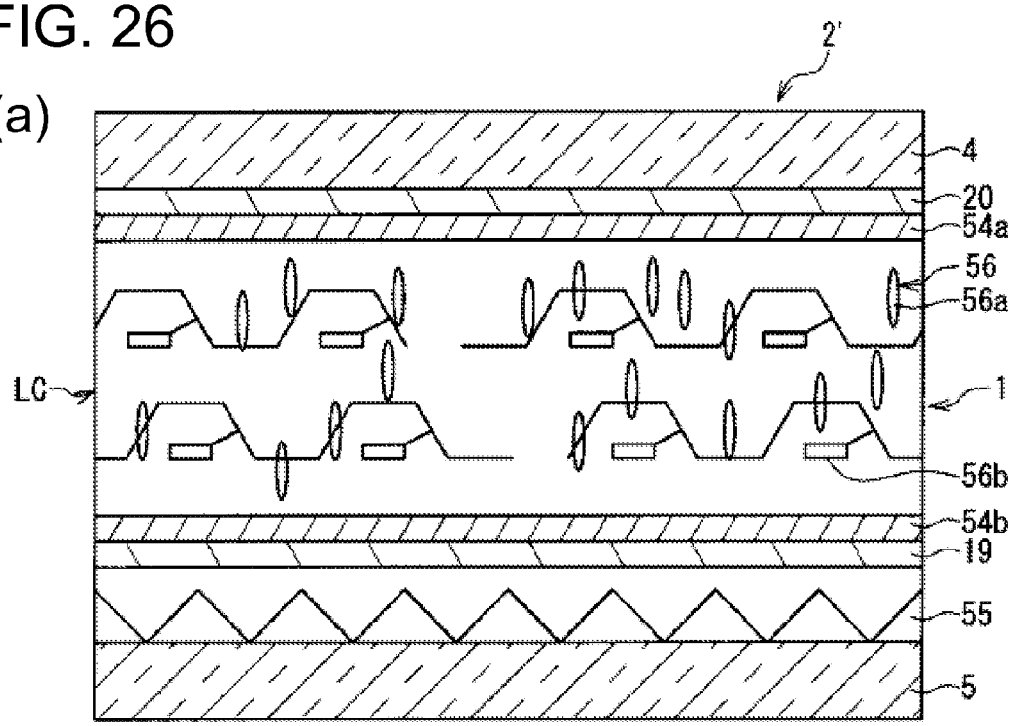
FIG. 26(a) and FIG. 26(b) illustrate a liquid crystal display device according to Embodiment 8 of the present invention when the voltage is ON and when the voltage is OFF, respectively.
Figure 26:
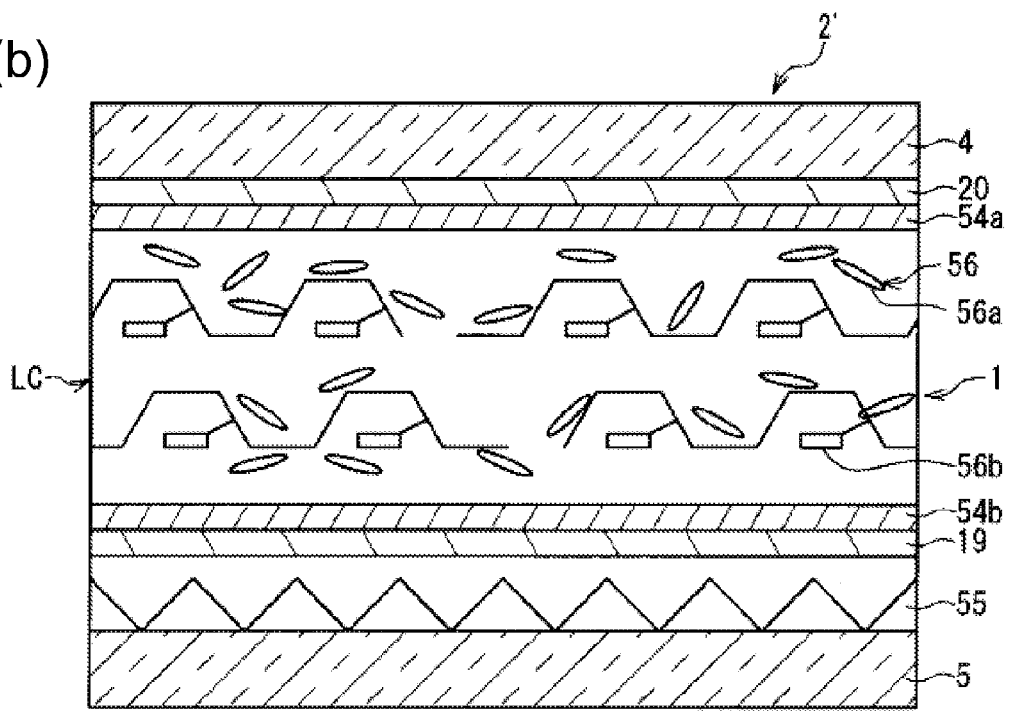
Figure 27:
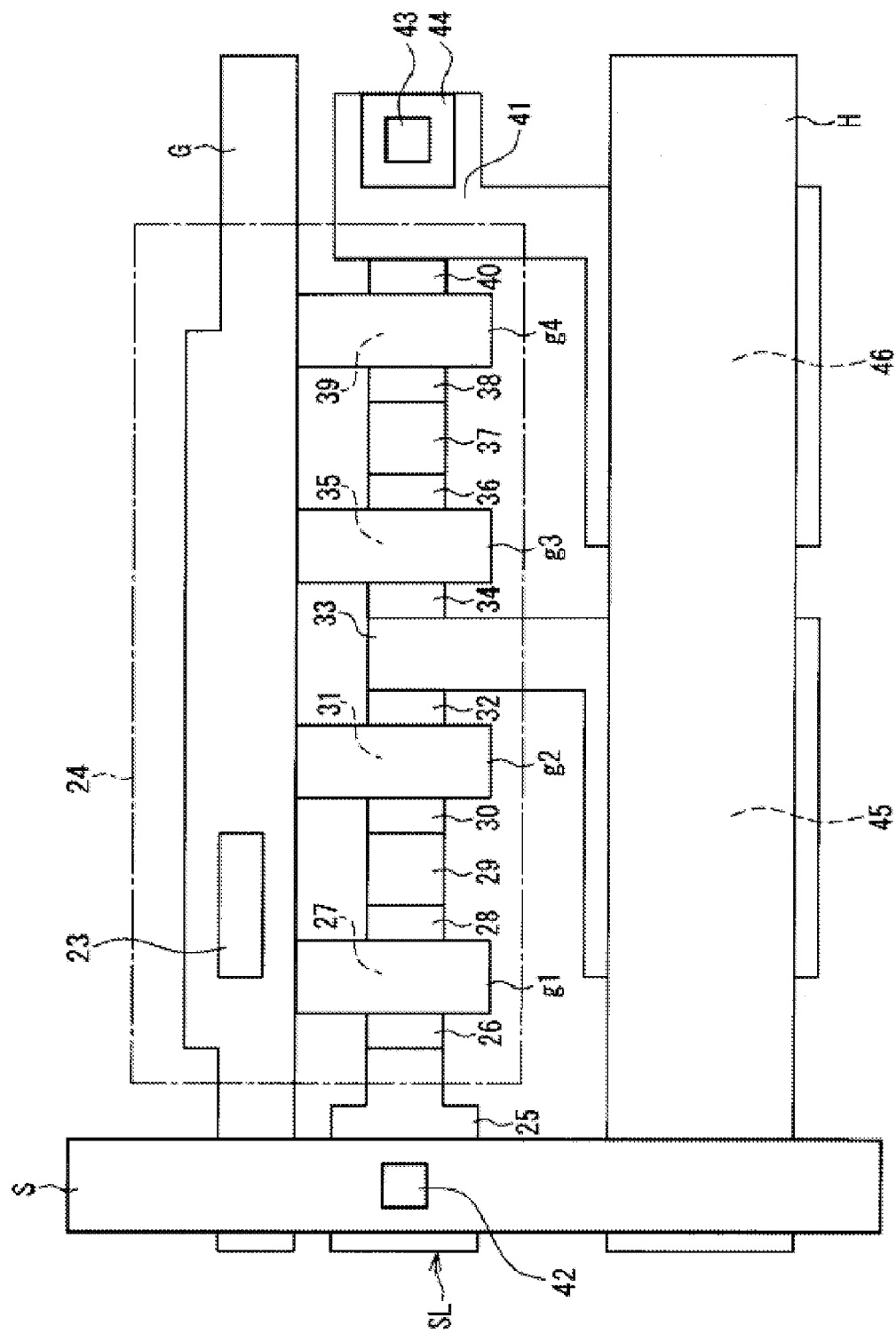
FIG. 27 is a plan view showing the configuration of the main part of a switching circuit used in the liquid crystal display device shown in FIG. 26.
Figure 28:
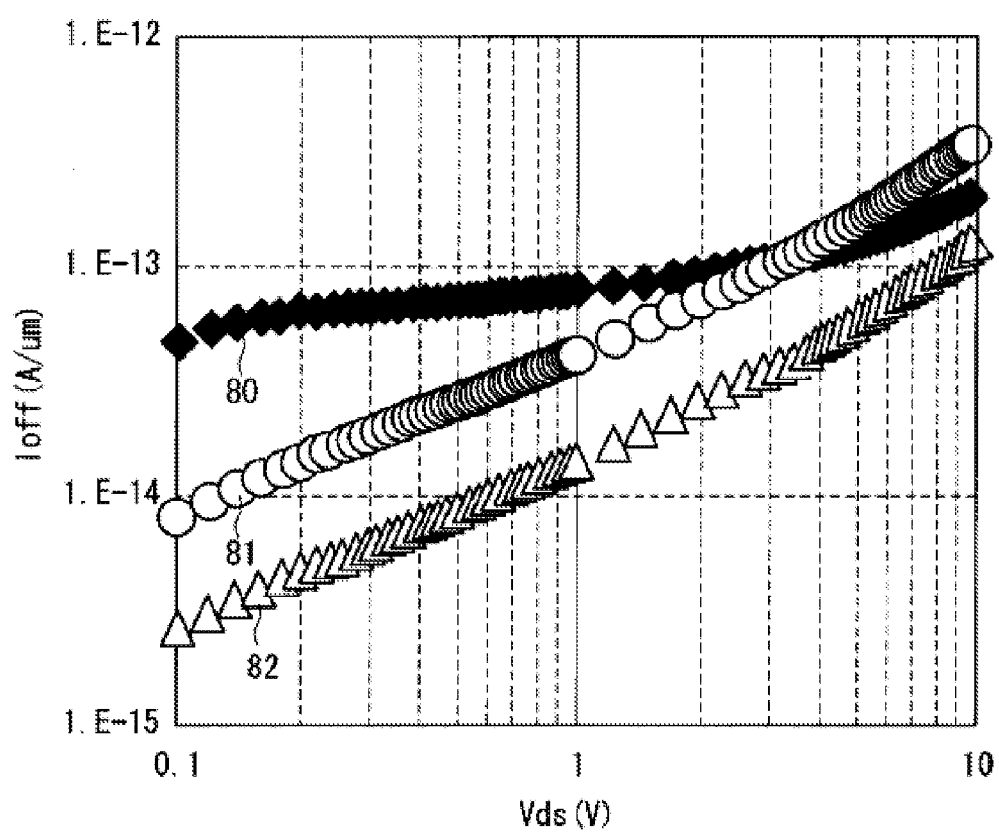
FIG. 28 is a graph showing the relationship between the source-drain voltage and the leakage current of a thin film transistor.

FIG. 26(a) and FIG. 26(b) illustrate the voltage ON/OFF states of a liquid crystal display device according to Embodiment 8 of the present invention. FIG. 27 is a plan view showing the configuration of the main part of the switching circuit used in a liquid crystal display device shown in FIG. 26. As shown in the figures, the main difference between this embodiment and Embodiment 1 is that, in this embodiment, a retroreflection type liquid crystal panel including a retroreflection sheet is used. For elements common to Embodiment 1, same reference characters are used and redundant descriptions are omitted.

That is, as shown in FIG. 26(a) and in FIG. 26(b), the liquid crystal display device 1 of this embodiment includes a retroreflection type liquid crystal panel 2'. In the liquid crystal panel 2', a common electrode 20 and a horizontal alignment film 54a are formed over the color filter substrate 4 in this order. On the active matrix substrate 5, a retroreflection sheet 55, a pixel electrode 19, and a horizontal alignment film 54b are disposed in this order. Between the horizontal alignment films 54a and 54b, a liquid crystal layer LC including polymer-dispersed liquid crystals 56 is provided. The polymer-dispersed liquid crystals 56 include liquid crystal molecules 56a and polymer liquid crystal bases 56b. Also in the polymer-dispersed liquid crystals 56, only liquid crystal molecules 56a respond to the electrical field and change their orientation.

Specifically, as shown in FIG. 26(a), when the voltage is ON, the liquid crystal molecules 56a are aligned in the electrical field direction, and the liquid crystal bases 56b do not change their orientation. As a result, the liquid crystal layer LC is transparent. Therefore, the light projected from above the color filter substrate 4 is refracted by the color filter substrate 4, the liquid crystal layer LC, and the like, reflected by the retroreflection sheet 55, refracted by the color filter substrate 4, the liquid crystal layer LC, and the like, and then arrives at the vicinity of the eyes of the viewer. As a result, only the light from the vicinity of the viewer's eyes is recognized by the eyes of the viewer. This produces a black display.

On the other hand, as shown in FIG. 26(b), when the voltage is turned OFF, the liquid crystal molecules 56a and the liquid crystal bases 56b are randomly oriented, and the liquid crystal layer LC is in a scattered state. Therefore, the light coming from above the color filter substrate 4 is scattered by the liquid crystal layer LC, and then after being reflected by the retroreflection sheet 55, is scattered by the liquid crystal layer LC. As a result, most of the light returns to the viewer's side. This produces a white display.

With the configuration described above, this embodiment can provide the functions and effects similar to those of Embodiment 1. Also in this embodiment, because a reflective liquid crystal panel 2' is used as the display unit, the pixel voltage fluctuation at the liquid crystal capacitance CLC of the liquid crystal panel 2' provided on one end of the switching circuit 18 can be suppressed, and therefore a liquid crystal display device 1 with a high display performance can easily be configured. Also in this embodiment, because the leakage current can reliably be suppressed to minimize the pixel voltage fluctuation, the frame frequency of the liquid crystal panel 2' can be reduced significantly. Also, because no (lower) light-shielding film blocking the light from the backlight device needs to be installed, a liquid crystal display device with a simple configuration featuring low power consumption can easily be configured.

Also in this embodiment, because a liquid crystal layer LC including polymer-dispersed liquid crystals 56 and a retroreflection sheet 55 are used, a reflective liquid crystal display device 1 featuring a high display performance using a retroreflection sheet 55 can be configured.

Other than the configuration described above, a configuration in which the switching circuit 18 according to any one of Embodiment 2 to Embodiment 7 is used may also be applicable.

Embodiments described above are all examples and are not limiting the present invention in any way. The technological scope of the present invention is defined by the appended claims and all changes that come within the range of equivalency of the claims are intended to be embraced therein.

For example, in the description above, the present invention is applied in the switching circuits for pixel electrodes used in the active matrix substrate of the liquid crystal display device. However, a semiconductor device of the present invention includes a switching unit having at least one switching element, and only needs to include a plurality of switching units connected in series to one another, and a plurality of capacitances, one electrode of each of the capacitances being connected to the corresponding connecting section of the plurality of switching units or to one end of the plurality of switching units, and to supply signals having a constant voltage or having a same phase to the other electrodes of the plurality of capacitances, and also to include a light-shielding film formed for at least the switching unit, among the plurality of switching units, having a capacitance disposed on both sides of the switching unit. A semiconductor device of the present invention is not limited in any other way.

Specifically, the present invention can be applied to, for example, transflective type and reflective type liquid crystal panels, various display devices such as organic EL (Electronic Luminescence) elements, inorganic EL elements, and field emission displays, and active matrix substrates used in those display devices. A semiconductor device of the present invention can be applied to switching circuits used in peripheral circuits such as driver circuits, as well as to switching circuits for the pixel electrodes. The number of the switching units connected in series is not limited to 2 to 3 as stated in descriptions above.

Also, cases in which one or two N-type transistors are used as the switching elements of the switching unit are described above. However, the switching elements of the present invention are not limited to such. For example, a switching element may be composed of an N-type transistor and a P-type transistor connected in parallel to each other.

However, as in embodiments described above, preferably an MIS (Metal-Insulator-Semiconductor) type transistor is used as the switching element of the switching unit, because this type of transistor can simplify the configuration of the switching unit, and therefore can readily configure a semiconductor device that is easy to manufacture.

Described above are configurations in which the frame frequency adjustment unit adjusts the frame frequency using both the detection results sent from the thermal sensor and the optical sensor and the image signal inputted. However, the frame frequency adjustment unit of the present invention is not limited to this. Other configurations may be employed as long as the frame frequency is adjusted based on at least either the detection results sent from the sensor that detects the condition of the surrounding environment of the display unit or the image signal inputted. That is, a frame frequency adjustment unit of the present invention may adjust the frame frequency appropriately by determining the level of leakage current in the switching circuit based on the detection result sent from the thermal sensor on the ambient temperature of the display unit, or the detection result sent from the optical sensor on the external light to which the display unit is exposed, and may also adjust the frame frequency appropriately in accordance with the display image displayed on the display unit.

Also, in the descriptions above, cases in which the upper light-shielding film is made of a conductive body and is electrically connected to the gate electrode wiring are described. However, an upper light-shielding film of the present invention is not limited to this. For example, instead of being electrically connected to the gate electrode wiring, the upper light-shielding film may be floated or may be constituted of a non-conductive body. However, if the upper light-shielding film is formed in the same layer with the source electrode and the drain electrode as in embodiments described above, the upper light-shielding film is preferably electrically connected to the gate electrode wiring.

Also in the description above, a low concentration impurity region (LDD region) is used in the silicon layer (semiconductor layer) constituting the storage capacitance (capacitance). However, the capacitance of the present invention is not limited to this, and a channel region, for example, may be used instead of the low concentration impurity region.

Also in the descriptions above, cases in which a top gate electrode structure transistor is used are described. However, a bottom gate electrode structure (reverse staggered structure) transistor may also be used, and in that case, the light-shielding film needs to be formed over the transistor. Also, this transistor may be microcrystalline silicon or an amorphous silicon transistor as well as a polycrystalline silicon transistor.

Although cases in which the bottom gate electrode is utilized as the (lower) light-shielding film is described, the present invention is not limited to this in any way. Specifically, the bottom gate electrode may also be configured using a transparent electrode, and a light-shielding film may be disposed under the semiconductor layer and under the bottom gate electrode. In such a configuration, a light-shielding film made of non-conductive body may also be used.

However, as in embodiments described above, utilizing the bottom gate electrode also as the light-shielding film is preferable in respect that such a configuration more reliably prevents the structure of the semiconductor device from becoming complex or oversized.

INDUSTRIAL APPLICABILITY

The present invention is useful for semiconductor devices that can reliably suppress the leakage current even when a plurality of switching units are connected in series and capacitances are connected to connecting sections of the switching units, and can suppress the voltage fluctuation at one end of the plurality of switching units, and is also useful for active matrix substrates and display devices using such a semiconductor device.

DESCRIPTION OF REFERENCE CHARACTERS

1 liquid crystal display device (display device)
2, 2' liquid crystal panel (display unit)
5 active matrix substrate
15 panel control unit (display control unit)
15c frame frequency adjustment unit
18 switching circuit (semiconductor device)
22 bottom gate electrode ((lower) light-shielding film)
24 upper light-shielding film
55 retroreflection sheet
56 polymer-dispersed liquid crystal
SW1 first switching unit
SW2 second switching unit
SW3 third switching unit
CS1 first storage capacitance (first capacitance)
CS2 second storage capacitance (second capacitance)
CS3 third storage capacitance (third capacitance)
SL silicon layer (semiconductor layer)
Tr1a, Tr1b, Tr1, Tr2a, Tr2b, Tr2, Tr3a, Tr3b, Tr3 thin film transistor (switching element)
g1, g2, g3, g4 gate electrode (top gate electrode)
CLC liquid crystal capacitance (external capacitance)
TS thermal sensor (sensor)
OS optical sensor (sensor)
LC liquid crystal layer

The invention claimed is:

1. A semiconductor device comprising a switching unit having at least one switching element,
wherein a plurality of said switching units are connected in series to each other, wherein said semiconductor device further includes a plurality of capacitances, one electrode of each of said capacitances being connected to corresponding one of connecting sections of said plurality of switching units or to one end of said plurality of switching units, wherein signals having a constant voltage or signals having a same phase are supplied to the other electrode of each of said plurality of capacitances, wherein said semiconductor device further includes a light-shielding film formed for at least the switching unit, among said plurality of switching units, that has a capacitance disposed on both sides of said switching unit, wherein said plurality of switching units are constituted of a first, a second, and a third switching units which are connected in series, and wherein when a capacitance value of a first capacitance connected between said first and said second switching units is Cs1, a capacitance value of a second capacitance connected between said second and said third switching units is Cs2, a capacitance value of a third capacitance connected to an end of said third switching unit on the side opposite from said second switching unit is Cs3, and an OFF leakage current values Ioff of said second and said third switching units are approximated in Equation (1), capacitance ratios R1, R2, and R3 of said first, second, and third capacitances satisfy Equation (4), Equation (5), and Equation (6) below, respectively:

$$Ioff = Io \times Vds^n \qquad (1)$$

$$R1 = \{n \times n/(n \times n + n + 1)\} \times \{(C+Cv)/C\} \pm 0.15 \qquad (4)$$

$$R2 = \{n/(n \times n + n + 1)\} \times \{(C+Cv)/C\} \pm 0.15 \qquad (5)$$

$$R3 = \{1/(n \times n + n + 1)\} \times \{(C - n \times n \times Cv - n \times Cv)/C\} \pm 0.10 \qquad (6),$$

where Vds is a voltage between one end and the other end of said second switching unit and said third switching unit (0≤Vds≤1); Io is a leakage current when Vds=1(V); n=0.7 to 0.8; Cs1:Cs2:Cs3=R1:R2:R3; R1+R2+R3=1; Cs1+Cs2+Cs3=C; and Cv is a capacitance value of an external capacitance connected in parallel to said third capacitance for said third switching unit.

2. The semiconductor device according to claim 1, wherein an MIS (Metal-Insulator-Semiconductor) type transistor is used as the switching element of said switching unit.

3. The semiconductor device according to claim 2, wherein said switching unit uses a double gate structure transistor including a semiconductor layer, and a top gate electrode and a bottom gate electrode disposed to sandwich said semiconductor layer, as said MIS type transistor.

4. The semiconductor device according to claim 3, wherein said top gate electrode and said bottom gate electrode are capacitively coupled with each other in said double gate structure transistor.

5. The semiconductor device according to claim 3, wherein said bottom gate electrode is used as said light-shielding film.

6. The semiconductor device according to claim 1, wherein said plurality of capacitances are connected in parallel to each other.

7. The semiconductor device according to claim 1, wherein said plurality of capacitances are split to be formed on both sides of said plurality of switching units to sandwich said plurality of switching units.

8. An active matrix substrate comprising the semiconductor device according to claim 1.

9. A display device comprising a display unit that displays information and the semiconductor device according to claim 1.

10. The display device according to claim 9, wherein said display unit is a liquid crystal panel.

11. The display device according to claim 9, wherein said display unit is a reflective liquid crystal panel.

12. The display device according to claim 11,
wherein said reflective liquid crystal panel includes polymer-dispersed liquid crystals in its liquid crystal layer, and
wherein said reflective liquid crystal panel is a retroreflection type liquid crystal panel including a retroreflection sheet.

13. The display device according to claim 9, comprising a sensor detecting a condition of environment surrounding the display unit; and a display control unit to which image signals are inputted and which performs drive control of said display unit,
wherein said display control unit includes a frame frequency adjustment unit that adjusts a frame frequency based at least on either detection results sent from said sensor or the image signals inputted.

14. The display device according to claim 13, wherein said frame frequency adjustment unit adjusts the frame frequency to or below a prescribed frequency in accordance with the image signal inputted.

* * * * *